United States Patent [19]
Hunt et al.

[11] Patent Number: 6,155,704
[45] Date of Patent: Dec. 5, 2000

[54] SUPER-RESOLVED FULL APERTURE SCENE SYNTHESIS USING ROTATING STRIP APERTURE IMAGE MEASUREMENTS

[75] Inventors: Bobby R. Hunt, Tucson, Ariz.; Gerard L. Rafanelli, Fountain Valley, Calif.; Philip J. Sementilli, Tucson, Ariz.; Susan B. Mount, Torrance, Calif.; Albert M. Bisbee, Tucson, Ariz.; James F. Montgomery, Hermosa Beach, Calif.; Stephen K. Johnson, Herndon, Va.

[73] Assignee: Hughes Electronics, El Segundo, Calif.

[21] Appl. No.: 08/635,073

[22] Filed: Apr. 19, 1996

[51] Int. Cl.[7] .............................. G01S 13/89; G01S 13/90
[52] U.S. Cl. ........................... 364/525; 342/351; 342/25; 342/191
[58] Field of Search .......................... 364/525; 342/351, 342/25, 53, 191, 179, 194, 195, 196, 197

[56] References Cited

U.S. PATENT DOCUMENTS

| | | | |
|---|---|---|---|
| 4,724,439 | 2/1988 | Wiley et al. | 342/351 |
| 4,876,602 | 10/1989 | Zwirn et al. | 348/625 |
| 5,122,803 | 6/1992 | Stann et al. | 342/25 |
| 5,122,805 | 6/1992 | Peterman et al. | 342/196 |
| 5,128,530 | 7/1992 | Ellerbroek et al. | 250/201.9 |
| 5,132,686 | 7/1992 | Witte | 342/25 |
| 5,160,934 | 11/1992 | Alpers et al. | 342/351 |
| 5,161,204 | 11/1992 | Hutcheson et al. | 382/157 |
| 5,164,730 | 11/1992 | Jain | 342/25 |
| 5,166,688 | 11/1992 | Moreira | 342/25 |
| 5,243,351 | 9/1993 | Rafanelli et al. | 342/351 |
| 5,350,911 | 9/1994 | Rafanelli et al. | 250/201.9 |
| 5,497,158 | 3/1996 | Schmid et al. | 342/25 |

OTHER PUBLICATIONS

Gifford et al., "Image Coding Using Adaptive Recursive Interpolative DPCM", IEEE Trans. on Image Processing, vol. 4, No. 8, Aug. 1995, pp. 1061–1069.

Hunt et al., "Bayesian Restoration of Millimeter Wave Imagery", 1994 IEEE Intnl. Conf. on Accoustics, Speech, and Signal Processing, Apr. 1994, pp. V/549–552 vol. 5.

Abousleman et al., "Entropy–Constrained Predictive Trellis Coded Quantization: Application to Hyperspatial Image Compression", 1994 IEEE Intnl. Conf. on Accoustics Speech, and Signal Processing, Apr. 1994, pp. V/253–256 vol. 5.

*Primary Examiner*—Eric W. Stamber
*Attorney, Agent, or Firm*—Leonard A. Alkov; William C. Schubert; Glenn H. Lenzen, Jr.

[57] ABSTRACT

A spinning strip aperture imaging radiometer sensor system and data processing method for synthesizing a super-resolved scene estimate (super-resolved scene) from a plurality of image frames acquired by the strip aperture imaging sensor system. One embodiment of the imaging system comprises a rotating strip aperture wide field of view telescope, a two dimensional detector array for detecting images in the focal plane of the telescope, rotation compensation apparatus for preventing rotational smear during the integration time of the detectors, a signal processor for recording a plurality of image frames of a scene that is imaged by the telescope as it rotates around its optical axis, and an estimation processor employing the present method for synthesizing the super-resolved scene estimate from the recorded images. The super-resolved image synthesis method uses a plurality of rotating strip aperture measurements within the strip aperture passband and within the passband of an equivalent bandlimited synthesized full circular aperture to estimate the spatial frequency information outside the total measurement passband, and/or outside the passband of the equivalent bandlimited synthesized full circular aperture, as well as within the equivalent bandlimited passband. Knowledge of the spatial response function of the strip aperture, the spatial response function of the detector array, noise statistics, and the temporal registrations of each of the recorded strip aperture images permits synthesis of the super-resolved full aperture image by the sensor system and image synthesis method. The super-resolved image synthesis method may be employed in the spatial domain, the spatial frequency domain, or both.

21 Claims, 16 Drawing Sheets

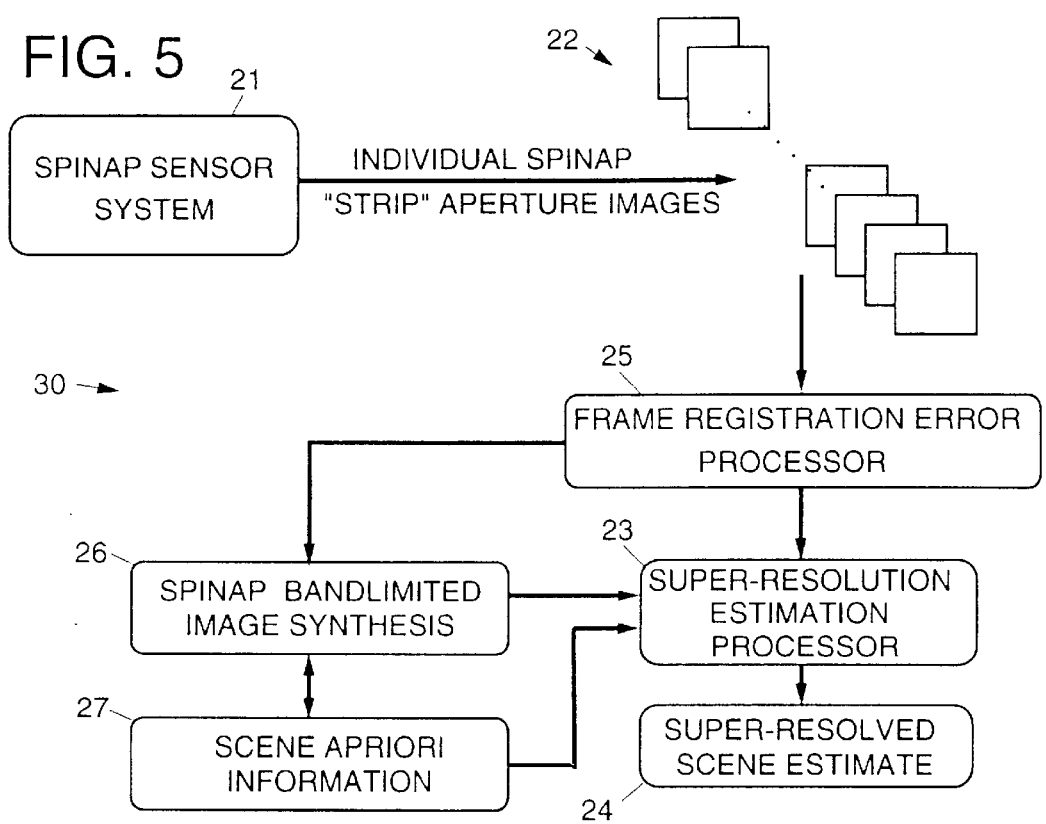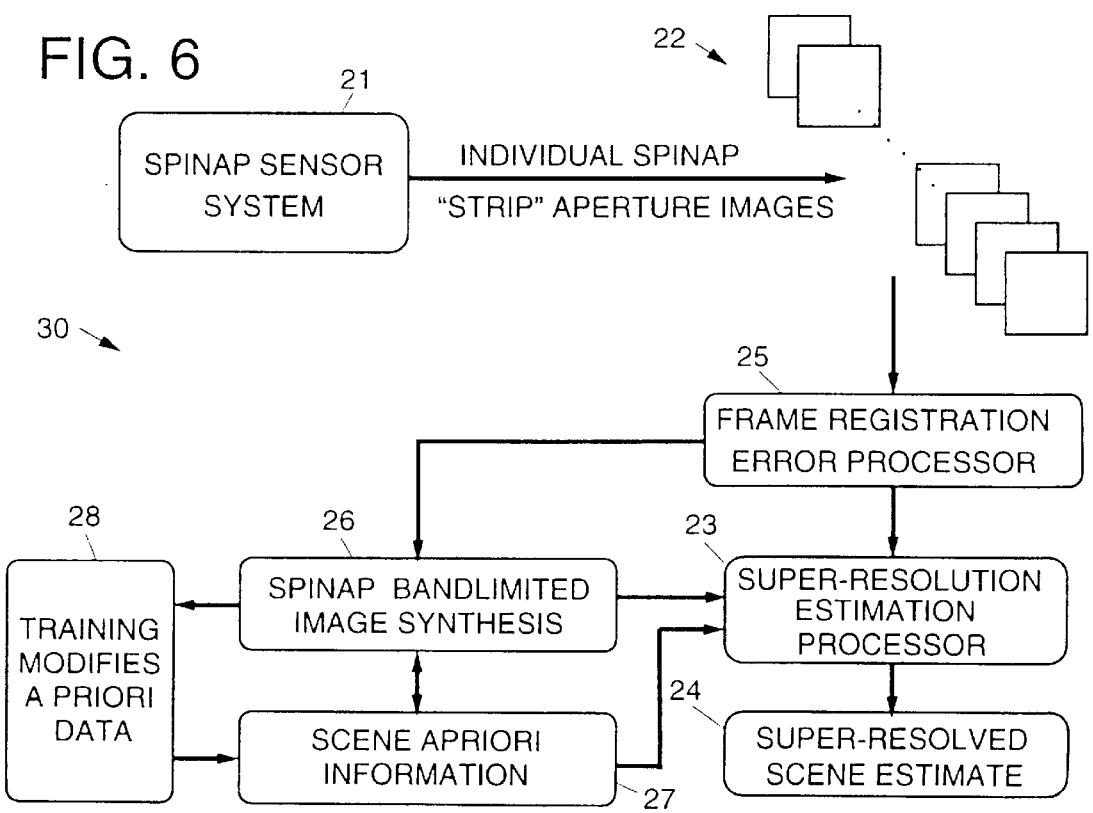

SUPER-RESOLVED FULL APERTURE SCENE SYNTHESIS USING ROTATING STRIP APERTURE IMAGE MEASUREMENTS

BACKGROUND

The present invention relates generally to spinning aperture radiometers and methods, and more particularly to spinning strip (partial) aperture imaging radiometers and methods that synthesize super-resolved scene estimates from a plurality of rotating strip aperture image measurements.

To provide high resolution images from space-based platforms, for example, conventional sensor architectures incorporate active control of large, heavy, deployable optical systems. Depending upon the mission requirements and the size of the primary mirror, the active control can range from periodic piston and tilt control of primary mirror segments to piston, tilt, figure, and alignment control of all optical elements comprising the sensor.

Full aperture systems with the same resolution as the present invention have a great deal of light gathering capability because of the relatively large aperture areas. However, to place multi-meter diameter apertures into orbit, full aperture systems competing with the present invention require: segmented optical surfaces and folded support structures, if the optical system diameters are larger than the launch vehicle's fairing; complex and potentially high bandwidth adaptive optical techniques, if thin deformable mirrors are used to save weight; and complex piston and pupil matching control, if implemented as a phased array. Therefore, the full aperture systems are relatively heavy and have relatively high technical risk and cost.

Prior art relating to and enhanced by the present invention is disclosed in U.S. Pat. No. 5,243,351 entitled "Full Aperture Image Synthesis Using Rotating Strip Aperture Image Measurements", assigned to the assignee of the present invention. The invention of U.S. Pat. No. 5,243,351 is known as the SpinAp system. The commonality between the approaches of the SpinAp system and the present invention (referred to herein as the SuperSpinAp system) arises from the use of temporally registered strip aperture measurements to synthesize an image, or estimate a scene.

Accordingly, it is an objective of the present invention to provide for spinning strip aperture imaging radiometers and methods that synthesize super-resolved scene estimates from a plurality of rotating strip aperture image measurements.

SUMMARY OF THE INVENTION

To meet the above and other objectives, one embodiment of the present invention provides for a spinning strip radiometer system and method that synthesizes super-resolved scene estimates from a plurality of rotating strip aperture image measurements. The expression super-resolved used herein refers to the ability of the present invention to accurately estimate scene information for spatial frequencies larger in magnitude than the aperture defined spatial frequency cutoff. Specifically, for the sensor system and data processing method described herein, super-resolution refers to extension of the information content of the estimated scene beyond the spatial frequency optical cutoff of the strip aperture system, and/or beyond the optical cutoff of the equivalent full circular aperture having radius equal to the largest correlation length associated with the strip aperture's geometry. The expression "strip aperture" refers to general aperture geometries described in U.S. Pat. No. 5,243,351.

The system includes a rotating strip aperture telescope that produces temporally contiguous or sequential images. The rotating strip aperture telescope typically comprises a rotating strip aperture primary reflector and a secondary reflector. A two dimensional detector array is provided to detect images located in the focal plane of the telescope. A rotation compensation device is employed to prevent rotational smear during the integration time of the detectors of the array. A signal processor is provided for recording a plurality of image frames of a target scene imaged by the telescope as the strip aperture rotates around the telescope's optical axis, and for synthesizing super-resolved estimates of the observed scene from the recorded images for spatial frequencies larger in magnitude than a spatial frequency cutoff of the rotating strip aperture, and/or beyond the optical cutoff of the equivalent full circular aperture of the SpinAp system.

The present invention thus provides for a spinning strip (partial) aperture imaging radiometer that synthesizes super-resolved radiometric scene estimates from a plurality of rotating strip aperture image measurements, while compensating for random, and/or systematic line of sight errors between individual strip aperture images. The present invention thus provides improved high resolution images when compared to the conventional SpinAp system for the same weight, or when compared to the conventional full aperture system of the same weight.

One embodiment of the synthesizing process performed by the sensor and processor of the present invention summarized above is as follows. As the spinning strip aperture rotates around the telescope's optical axis the following occurs. The rotation compensation device counter-rotates during the integration time of the detectors, thereby providing a temporally stationary image. An image frame is recorded and saved. If a rotating (relative to the scene) detector array architecture has been selected, the acquired frame is coordinate transformed and interpolated to a reference grid of the (not super-resolved) synthesized image. The data is Fourier transformed and stored. A new frame is recorded and saved. An estimate of the frame-to-frame misregistration of the recorded data due to random line of sight errors is obtained. The strip aperture images, or the Fourier transforms, are corrected for their line of sight errors and are stored. The preceding steps are sequentially repeated for each strip aperture image frame, or the frames are sequentially acquired and stored, and then global estimates of the line of sight are determined to register the frames.

Once the individual strip aperture frames have been registered, the super-resolution synthesis process begins. One embodiment of the super-resolution synthesis process incorporates the following steps. The desired amount of passband extension is used to determine the sample spacing for the synthesized super-resolved image. The coordinate system and spatial grid associated with the super-resolved image is referred to herein as a high resolution or super-resolution grid. Starting estimates of the super-resolved synthesized image and the mean value of the super-resolved image on the high resolution grid are determined. The starting estimate for the super-resolved image can be obtained by applying the SpinAp processing approach to the data, low pass spatial frequency filtering to obtain low noise samples, compensating for the full aperture transfer function, and expanding the estimate to the super-resolution grid by pixel replication. The starting estimate for the mean value of the super-resolved image can be obtained in a similar manner.

Once the starting points have been established, the non-linear and iterative super-resolution technique forms subsequent estimates of the super-resolved scene by forming a product of the current estimate of the super-resolved scene with a nonlinear function of the current estimate. The nonlinear function is an exponential product of the plurality of rotational measurements scaled by the number of frames measured. The arguments of the exponentials are a function of the measurements, the strip aperture sensor's response function, and the current super-resolved scene estimate. The argument of the exponentials associated with each rotational position is obtained by performing a convolution of the response function of the reflected strip aperture for the particular rotational position with an auxiliary function. One element of the auxiliary function generation consists of dividing the pixel measurements by the convolution of the current estimate of the super-resolved scene with the spatial response function of the strip aperture for the particular rotational position.

Since each embodiment of the radiometer system and image synthesis processing method depends upon specific mission requirements and engineering tradeoffs, the radiometer system and image synthesis method incorporates means to compensate for random, and/or systematic line of sight drift between frames, and a priori and a posteriori known error sources, such as, non-isoplanatic optical system point spread functions, field point independent image smear due to image motion and finite electronic bandwidth of the detectors, and field point dependent image smear caused by uncompensated rotational motion of the image.

Incorporating a priori or a posteriori knowledge, such as the use of Markov Random Fields to implement postulates concerning scene structure, the use of total energy measurement criteria, or the use of alternate conditional probability density functions lead to straight forward modifications to the processing technique just described. The performance of the compensation techniques employed in the present system and method depend upon the accuracy of the a priori and a posteriori knowledge, and the effective signal to noise ratio.

The present system and method provide for an enhanced SpinAp class of space based optical imaging sensors and processing architectures that is capable of providing super-resolved imagery from an optical system comprising a rotating strip aperture. The image measurement and synthesis procedures of the present invention have advantages of providing a lower risk, lower cost, lighter weight, simpler fabrication and deployment alternative to deploying complex, large aperture adaptive optical systems for space based high resolution imaging applications.

The present system and method provide high resolution imagery from a satellite orbit, particularly when the weight of the telescope is a sizable fraction of the weight of the payload. The cost of launching a satellite is, in large, a function of its weight in orbit. Depending on operational system conditions, it is estimated that for a given allowable telescope weight, the present invention can provide up to 50% higher resolution than the conventional SpinAp system. The present invention may be used in such systems as high resolution (equivalent to large aperture) space based observatories.

The SuperSpinAp system makes use of the available measurements to generate a full aperture image, having a spatial frequency cutoff beyond the spatial frequency cutoff associated with the largest correlation length associated with the strip aperture, i.e. beyond the equivalent SpinAp (bandlimited) synthesized full aperture spatial frequency cutoff. The SuperSpinAp imagery is representative of images generated from a SpinAp strip aperture having a greater correlation length. Therefore, it would be an advantage to have a modified SpinAp image processing method that would result in lower payload weight for a given effective synthesized aperture size. Furthermore, it would also be advantageous to have a system and image processing method that provides a lower risk, lower cost, lighter weight, and simpler fabrication deployment alternatives to deploying complex, large full circular apertures (or phased array telescopes) requiring complex adaptive optical systems for space based imaging applications. In addition, since the super-resolution estimation techniques permit estimation of scene information outside the passband of the strip aperture, the SuperSpinAp processing procedure can provide the same synthesized image quality as SpinAp with fewer rotational samples.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 5 illustrates a fourth embodiment of the present invention;

FIG. 6 illustrates a fifth embodiment of the present invention;

DETAILED DESCRIPTION

Figure 1:
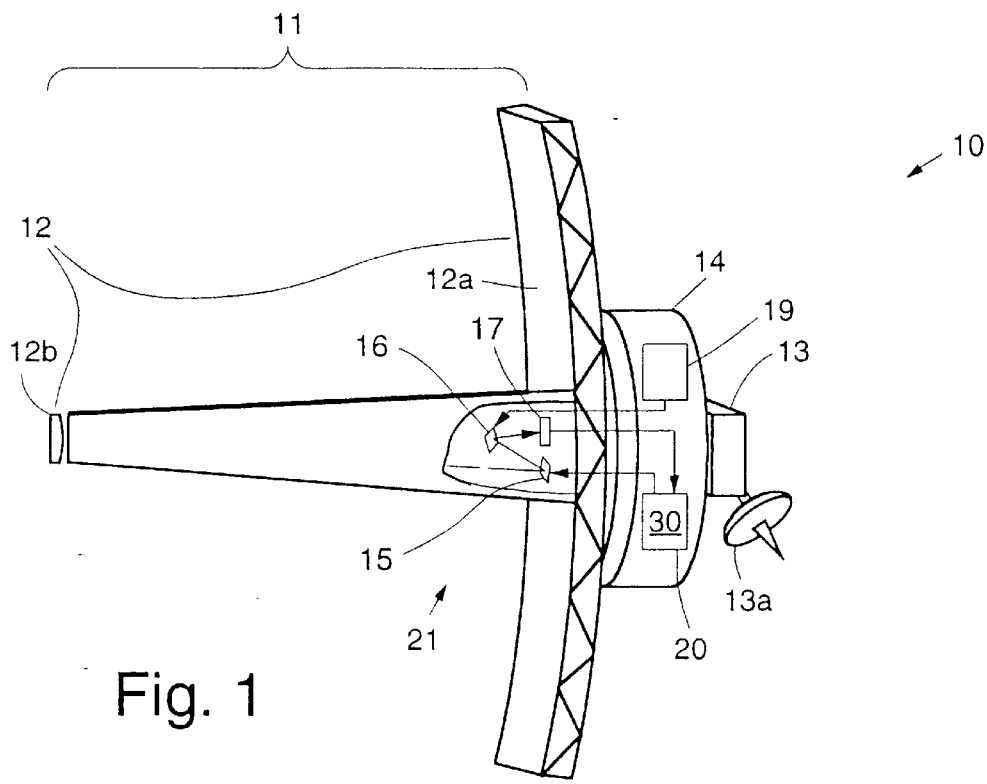
FIG. 1 illustrates a spinning aperture imaging radiometer system in accordance with the principles of the present invention.

Referring to the drawing figures, FIG. 1 corresponds to FIG. 1 of U.S. Pat. No. 5,243,351, and provides an example of a spinning aperture imaging radiometer system 10 in accordance with and modified by the principles of the present invention. The contents of U.S. Pat. No. 5,243,351 are incorporated herein by reference. The spinning aperture imaging radiometer system 10 is adapted to synthesize super-resolved scene estimates, while removing line of sight jitter, and provide improved high resolution images when compared to conventional optical systems of the same weight, and when compared to a SpinAp system of the same weight. The spinning aperture imaging radiometer system 10 comprises a rotating strip aperture telescope 11 that includes primary 12a and secondary reflectors 12b. A tertiary reflector (not shown) may be employed in the telescope 11 under certain circumstances.

For the purposes of the present disclosure, the system 10 is shown in the form of a satellite comprising a stationary section 13 having an earth pointing antenna 13a. The telescope 11 is disposed on a platform 14, to which the stationary section 13 is also coupled. The spinning aperture imaging radiometer system 10 is adapted to record a number of image frames of a target scene imaged by the telescope 11 as the primary mirror 12a (comprising a strip aperture) rotates around the optical axis of the telescope 11. A line of sight stabilization mirror 15 and an image derotation device 16 are disposed along the optical path of the telescope 11 that are adapted to stabilize and derotate the image prior to its sensing by a detector array 17. The derotation device 16 counter rotates the image during the integration time of detectors comprising the detector array 17, under control of a rotation compensation controller 19, thereby providing a stationary image. The line of sight stabilization mirror 15 is used by a line of sight control system (such as may be provided by a signal processor or other dedicated control system) to remove high bandwidth line of sight errors, as well as line of sight errors due to orbital dynamics of the system 10. The target scene is imaged onto the detector array 17 located at the focal plane of the telescope 11 that is coupled to the signal processor 20 that is adapted to process the image frames. Alternatively, the signal processor 20 may comprise dedicated ground processor. The telescope 11, detector array 17 and related hardware are referred to herein as a sensor system 21. Individual image frames produced by the sensor system 21 are processed and combined in the signal processor 20 to synthesize super-resolved scene estimates in accordance with systems 10 and methods 30 of the present invention, and that are more specifically illustrated with reference to FIGS. 2–11.

Specific embodiments of SuperSpinAp systems 10 and methods 30 are described below. More specifically, FIGS. 2–11 illustrate various embodiments of the SuperSpinAp processing methods 30 in accordance with the principles of the present invention employed by the spinning aperture radiometer system and methods associated with FIG. 1 appropriately modified to implement the principles of the present invention. A particular embodiment is selected based upon the observational scenario and timelines, the amount of available prior knowledge, and the available computational throughput of the processing chain.

Figure 2:
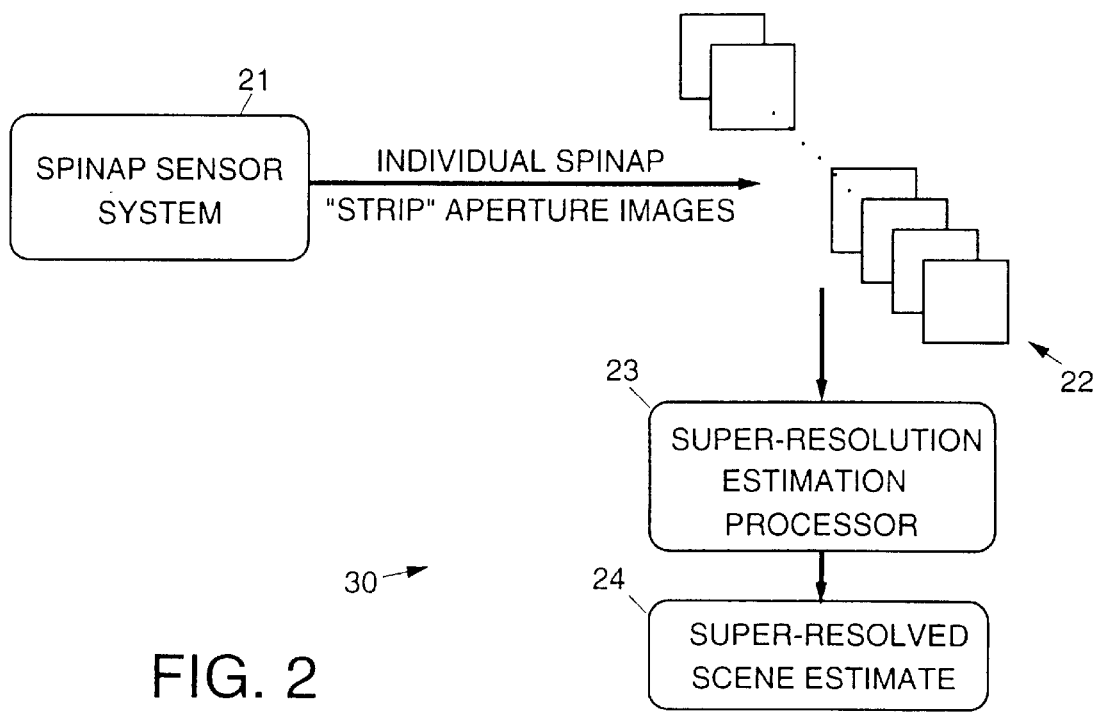
FIG. 2 illustrates a first embodiment of a system and method in accordance with the principles of the present invention.

FIG. 2 illustrates a first embodiment of a system 10 and method 30 in accordance with the present invention, comprising a top level SuperSpinAp image synthesis method 30 implemented in the signal processor 20. The SpinAp sensor 21 acquires and generates a set of strip aperture images 22 that are transferred to the SuperSpinAp processor 23. The SuperSpinAp processor 23 synthesizes a super-resolved scene estimate 24.

Figure 3:
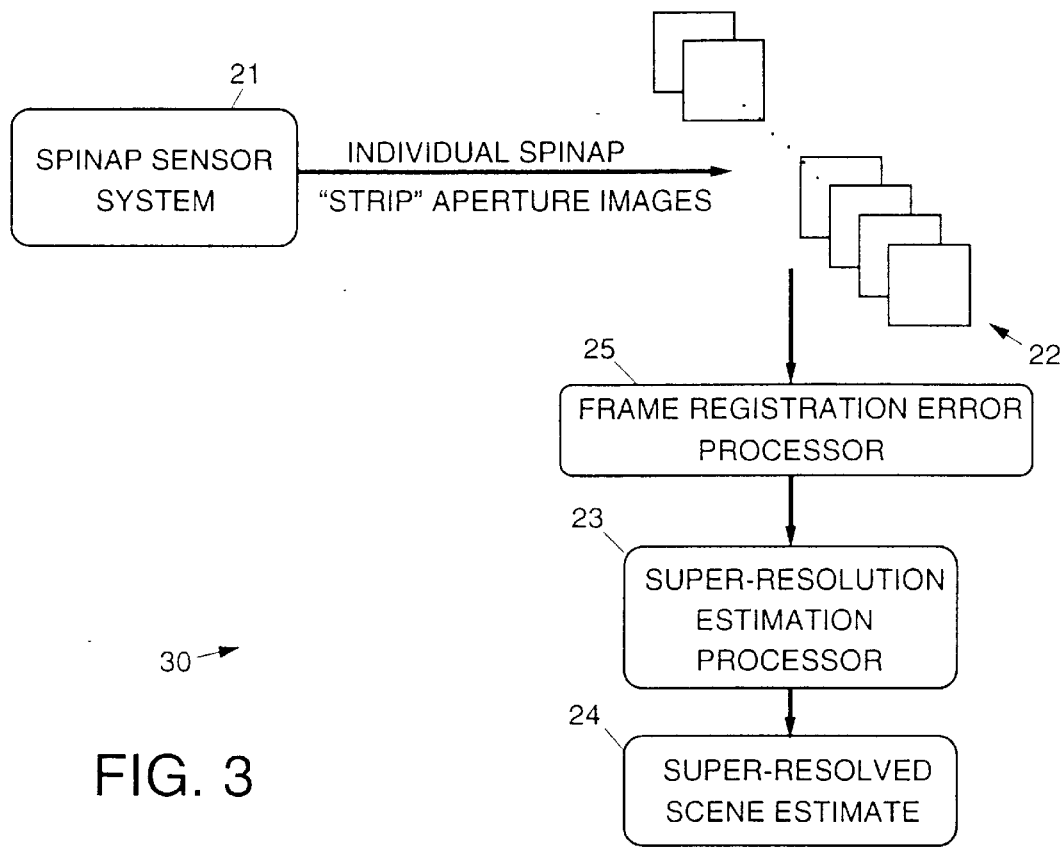
FIG. 3 illustrates a second embodiment of the present invention.

Referring to FIG. 3, a second system 10 and method 30 is illustrated. The SpinAp sensor 21 acquires and generates a set of strip aperture images 22, which are transferred to the frame registration error processor 25. The frame registration error processor 25 determines the residual registration errors between the individual frames of the set. By way of example, frame registration may be accomplished as follows. As the spinning strip aperture rotates around the optical axis of the telescope 11, the following occurs. The derotation device 16 counter-rotates during integration time of the detector array 17 to provide a temporally stationary image. An image frame is recorded and saved. If a rotating (relative to the scene) detector array architecture has been selected, the acquired frame is coordinate transformed and interpolated to a reference grid of the (not super-resolved) synthesized image. The data is Fourier transformed and stored. A new frame is recorded and saved. An estimate of the frame-to-frame misregistration of the recorded data due to random line of sight errors is obtained. The strip aperture images, or the Fourier transforms, are corrected for their line of sight errors and are stored. The preceding steps are sequentially repeated for each strip aperture image frame, or the frames are sequentially acquired and stored, and then global estimates of the line of sight are determined to register the frames. The registration processor 25 transfers the set of corrected frames, the set of uncorrected frames and registration error estimates between the frames, or both to the super-resolution processor 23. Using the corrected frames, or the uncorrected frames and the corresponding set of registration errors, the super-resolution estimation processor 23 generates the super-resolved scene estimate 24.

Figure 4:
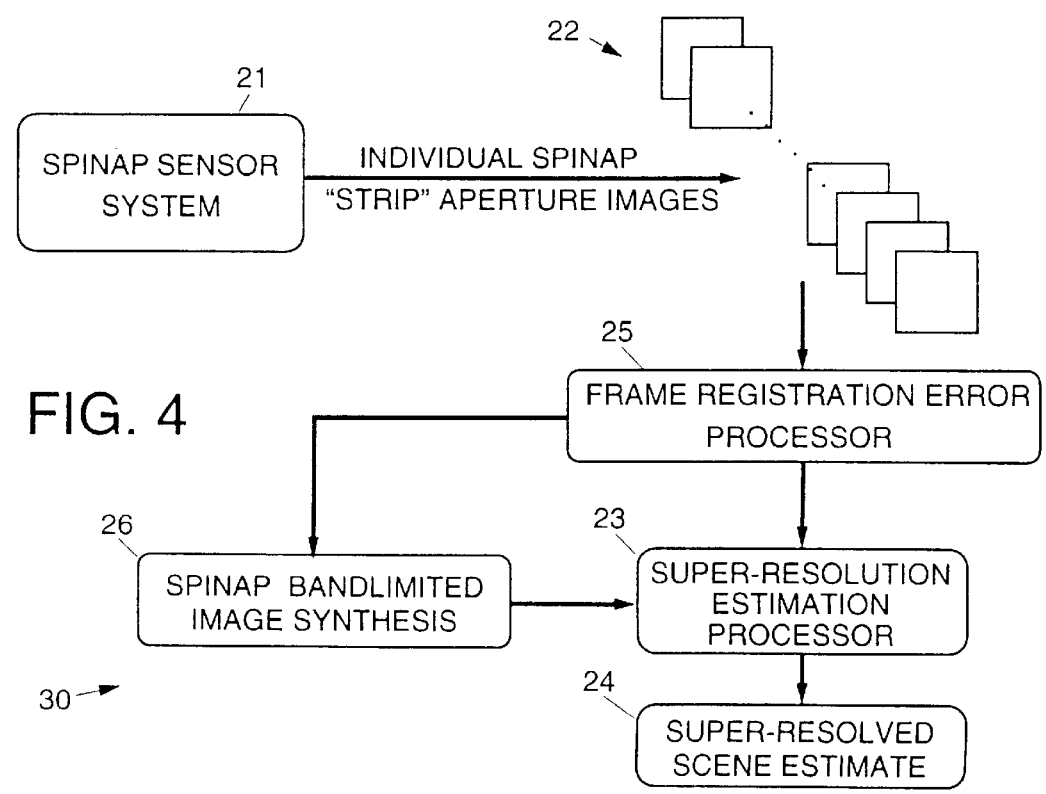
FIG. 4 illustrates a third embodiment of the present invention.

Referring to FIG. 4, a third system 10 and method 30 is illustrated. The SpinAp sensor 21 acquires and generates a set of strip aperture images 22, which are transferred to the frame registration error processor 25. The frame registration error processor 25 determines the residual registration errors between the individual frames of the set. The registration processor 25 transfers the set of corrected frames, the set of uncorrected frames and registration error estimates between the frames, or both, to a SpinAp bandlimited image synthesis processor 26 and the super-resolution estimation processor 23. The SpinAp bandlimited image synthesis processor 26 generates images representative of full circular aperture images by means of the SpinAp process described in U.S. Pat. No. 5,243,351. Using the corrected frames, the set of uncorrected frames and registration error estimates between the frames, or both, as well as the SpinAp bandlimited image, the super-resolution estimation processor generates an estimate of the super-resolved scene 24.

Referring to FIG. 5, a fourth system 10 and method 30 is illustrated. The SpinAp sensor 21 acquires and generates a set of strip aperture images 22, which are transferred to the frame registration error processor 25. The frame registration error processor 25 determines the residual registration errors between the individual frames of the set. The registration processor transfers the set of corrected frames, the set of uncorrected frames and registration error estimates between the frames, or both to the super-resolution processor 23. In addition, the correctly registered frames, or the set of uncorrected frames and the registration error estimates between the frames are transferred to the SpinAp bandlimited image synthesis processor 26. The SpinAp bandlimited image synthesis processor 26 generates images representative of full circular aperture images by means described in U.S. Pat. No. 5,243,351, while incorporating a priori knowledge of the scene or object structure stored in an image synthesis data base 27. Using the corrected frames, or the uncorrected frames and the corresponding set of registration errors, as well as the SpinAp bandlimited image, the super-resolution estimation processor generates the super-resolved scene estimate 24, while incorporating a priori knowledge of the scene or object structure stored in data base 27.

Referring to FIG. 6, a fifth system 10 and method 30 is illustrated. The SpinAp sensor 21 acquires and generates a set of strip aperture images 22, which are transferred to the frame registration error processor 25. The frame registration error processor 25 determines the residual registration errors between the individual frames of the set. The registration processor transfers the set of corrected frames, the set of uncorrected frames and registration error estimates between the frames, or both to the super-resolution processor 23. In addition, the correctly registered frames, or the set of uncorrected frames and the registration error estimates between the frames are transferred to the SpinAp bandlimited image synthesis processor 26. The SpinAp bandlimited image synthesis processor 26 generates images representative of full circular aperture images by means described by U.S. Pat. No. 5,243,351, while incorporating a priori knowledge of the scene or object structure stored in data base 27. The bandlimited SpinAp image is transferred to a training algorithm processor 28. Based upon information obtained from the SpinAp bandlimited image, the training processor extracts scene content and structure information, which is used to modify the a priori information contained in the data base 27. Using the corrected frames, or the uncorrected frames and the corresponding set of registration errors, as well as the SpinAp bandlimited image, the super-resolution estimation processor 23 generates the super-resolved scene estimate 24, while incorporating the a priori knowledge of the scene or object structure stored in data base 27, and modified by the training algorithm processor 28.

Figure 7A:
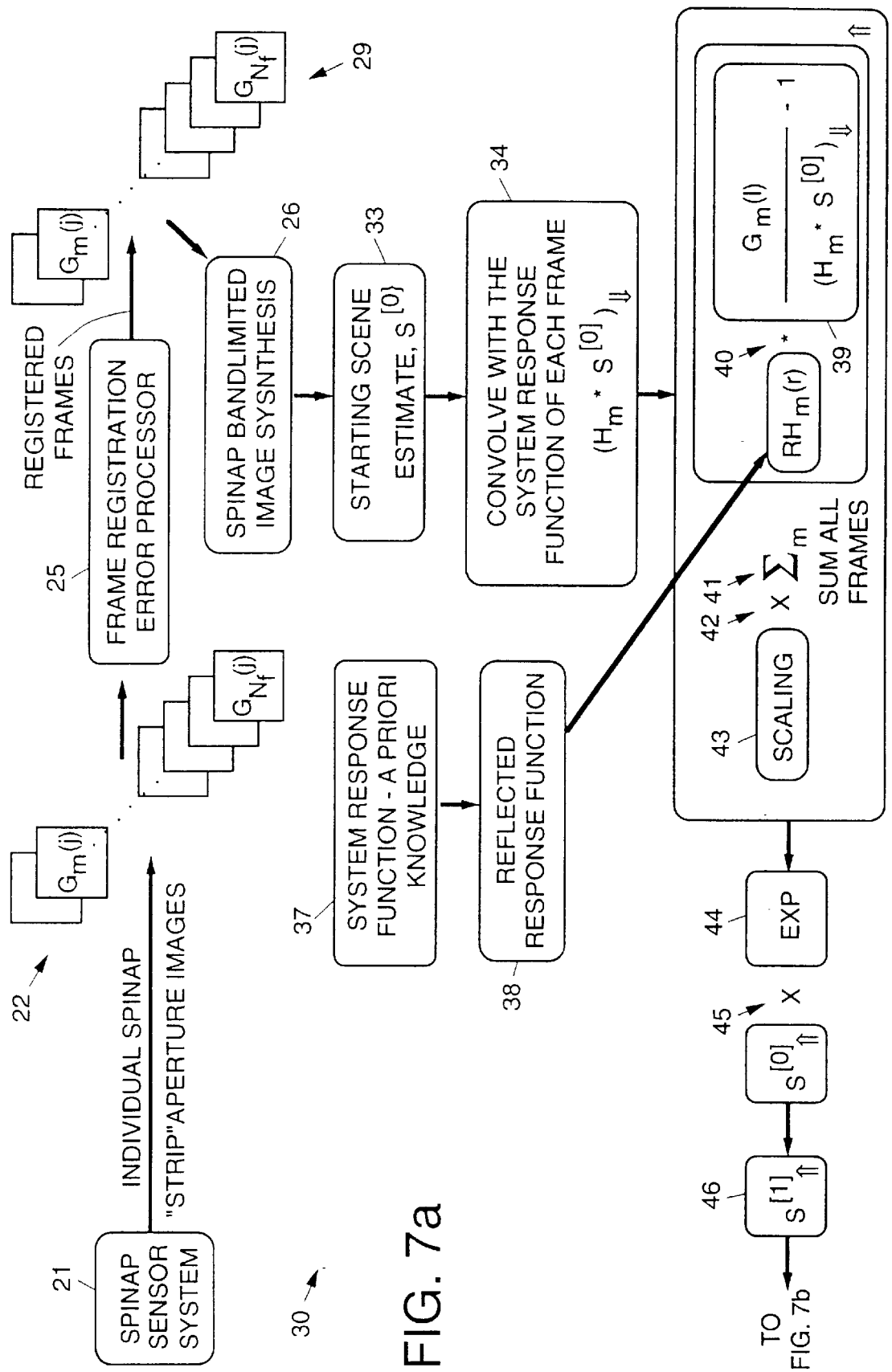
FIGS. 7a and 7b depict an embodiment of a super-resolution processing method associated with the inventions of FIGS. 2–6.
Figure 7B:
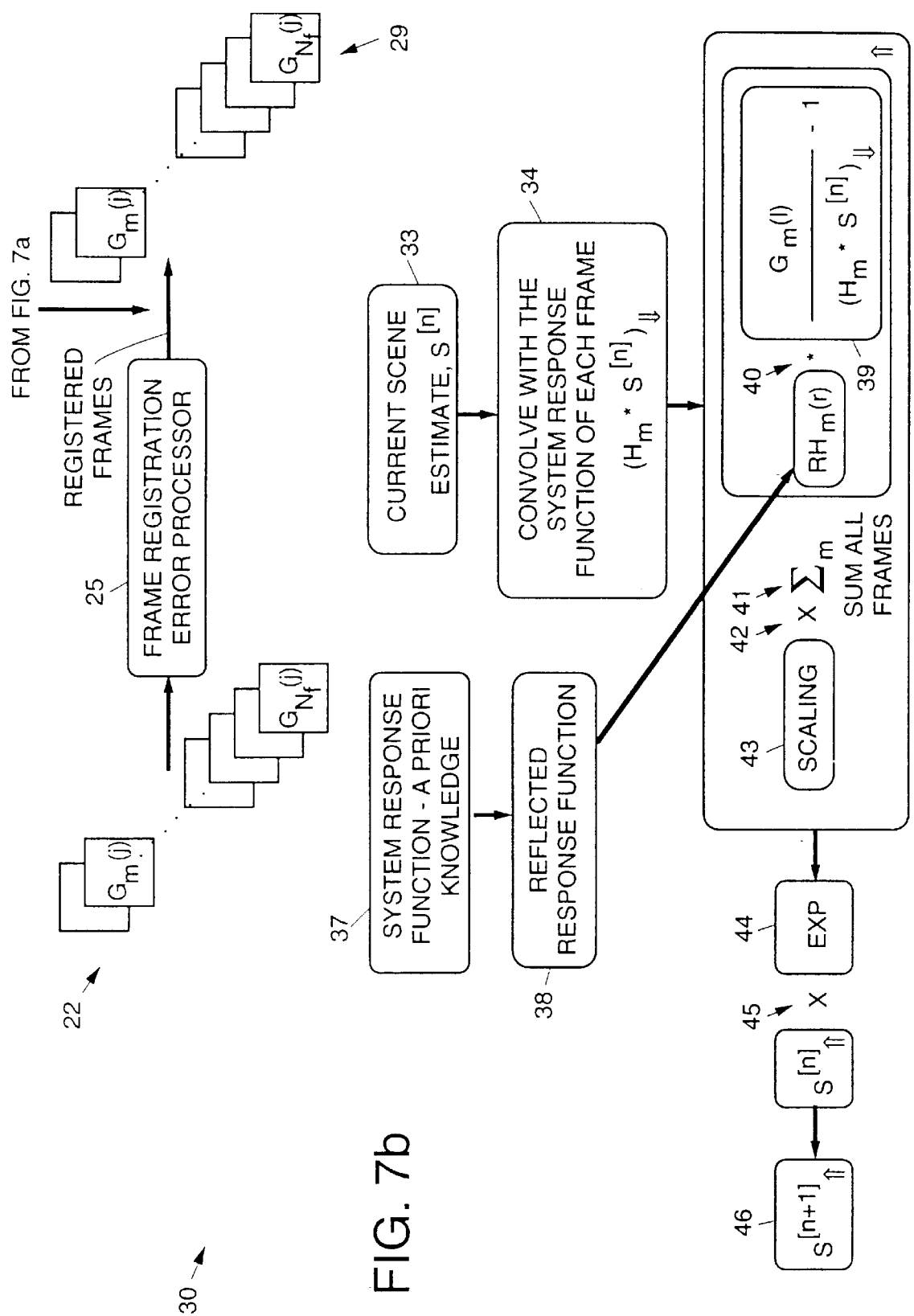

Realizations of SuperSpinAp processing are described below. FIGS. 7a and 7b depict an embodiment of the SpinAp super-resolution processing method used in the systems 10 and methods 30 of FIGS. 2–6. In the method depicted in FIGS. 7a and 7b, the SpinAp sensor 21 acquires and generates a set of strip aperture images 22, which are transferred to the frame registration error processor 25. The frame registration error processor 25 determines the residual registration errors between the individual frames of the set. The registration processor transfers the set of corrected frames 29 and registration error estimates between the frames to the super-resolution processor 23.

In addition, the correctly registered frames and the error estimates between the frames are transferred to the SpinAp bandlimited image synthesis processor 26. The SpinAp bandlimited image synthesis processor 26 generates images representative of full circular aperture images by means described by the U.S. Pat. No. 5,243,351. The bandlimited SpinAp image is modified to provide a first estimate 33 of the super-resolved scene.

The current super-resolved scene estimate 33 and the a priori information of the system response function 37 are used to determine the measurements for each frame that would result from observation of a current scene estimate 34. The determination of the anticipated measurements 34 is accomplished by convolving the current super-resolved scene estimate 33 with the system response function of the individual frames 37. The next steps 39 and 40 in the processing chain correspond to dividing the measurements 22, and the anticipated measurements 34 and subtracting unity, which is then convolved 40 with each frame's reflected response function 38. The resulting convolution 40 is summed for each frame 41 and then multiplied 42 by a scaling factor 43. The last steps in the first super-resolved estimates are to exponentiate 44 the output of steps 39 through 43 and multiply 45 the exponentiated result by the current super-resolved scene estimate 34. The result of steps 21 through 45 is the first true estimate 46 of the SpinAp super-resolved scene. The first true estimate 46 of the SpinAp super-resolved scene is then used as the current scene estimate 33, and the process continues for the desired number of iterations.

Figure 8A:
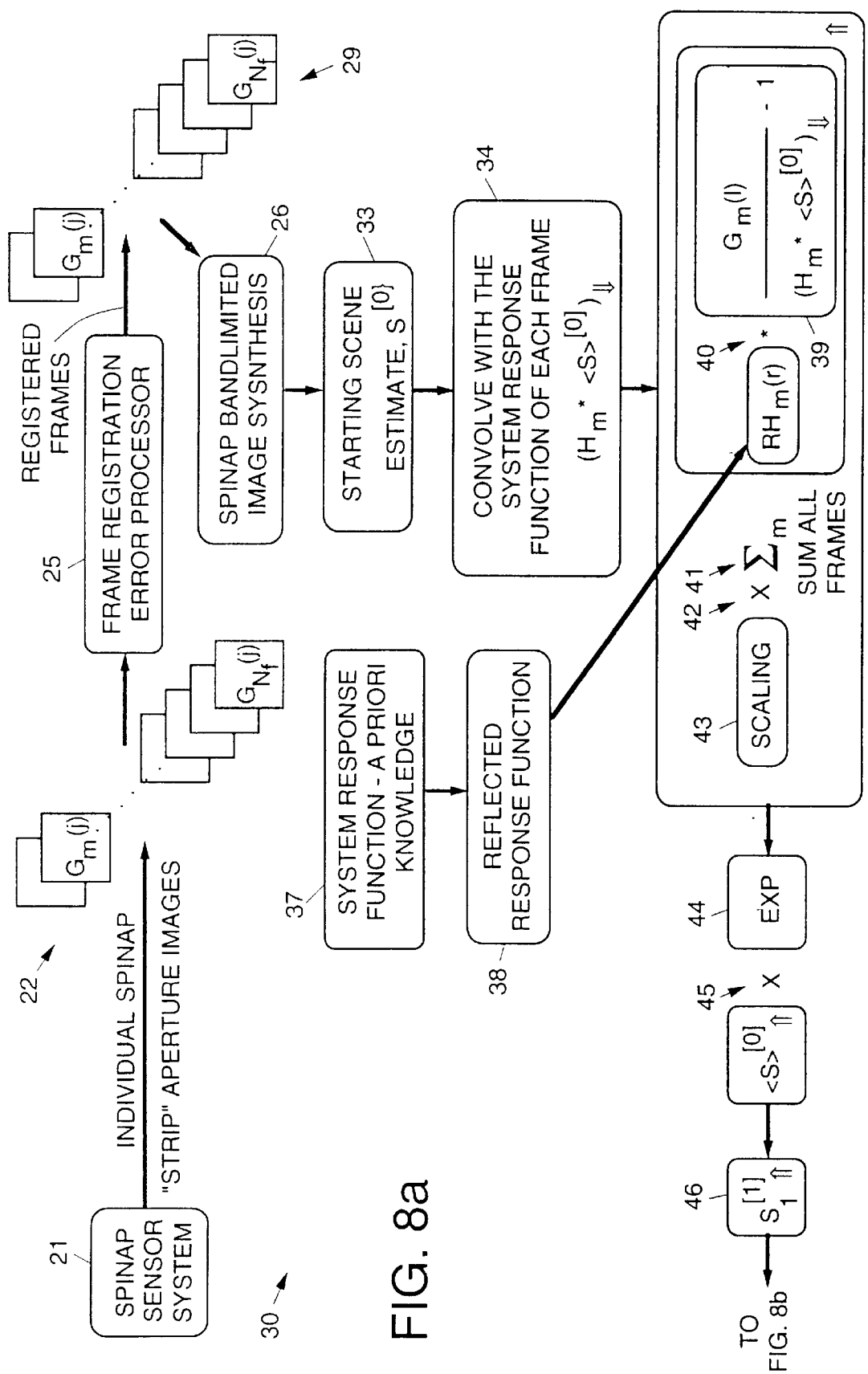
FIGS. 8a and 8b depict an embodiment of another super-resolution processing method associated with the inventions of FIGS. 2–6.
Figure 8B:
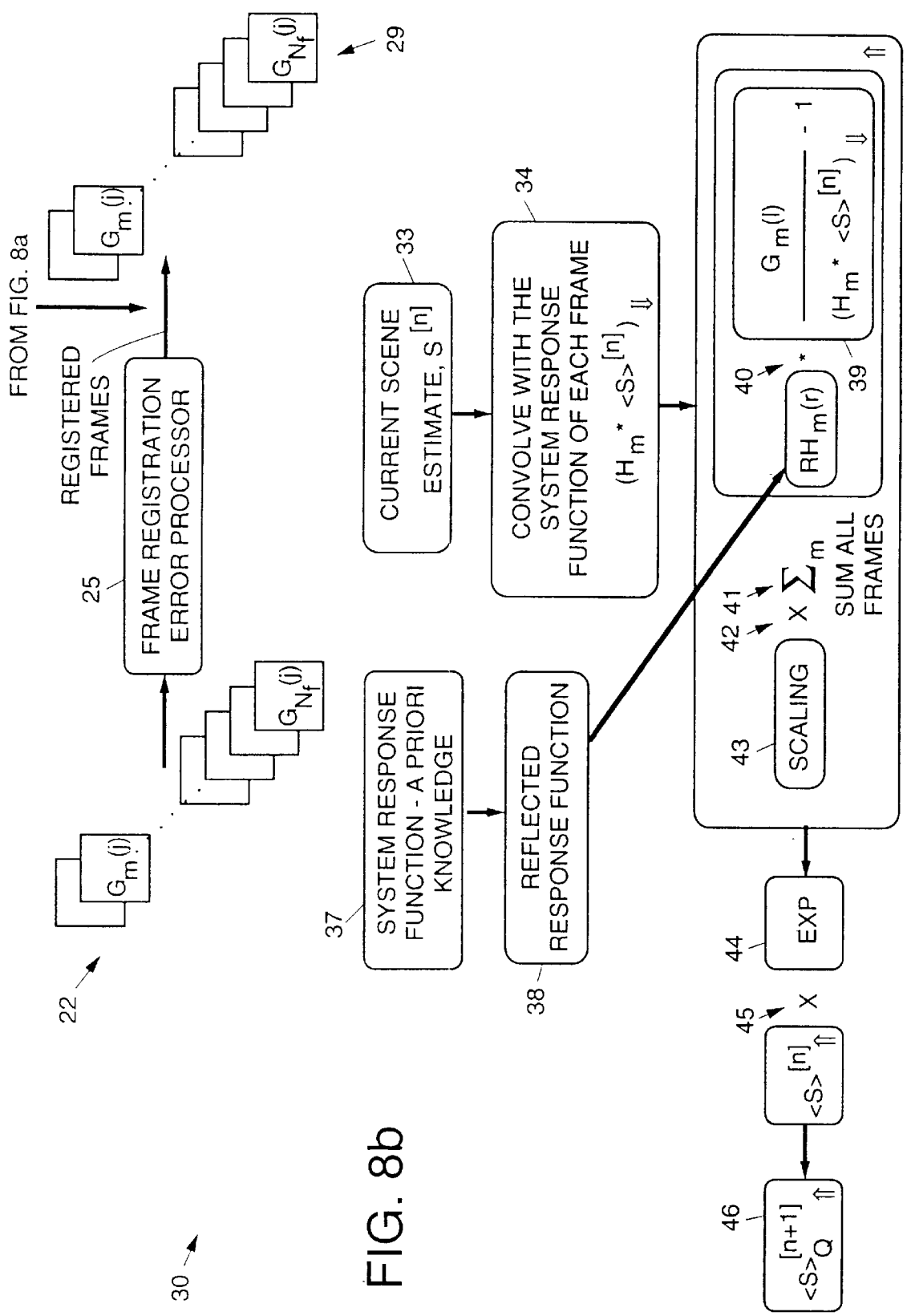

FIGS. 8a and 8b depict another embodiment of the SpinAp super-resolution processing method used in the systems 10 and methods 30 of FIGS. 2–6. In the method, depicted in FIGS. 8a and 8b the SpinAp sensor 21 acquires and generates a set of strip aperture images 22, which are transferred to the frame registration error processor 25. The frame registration error processor 25 determines the residual registration errors between the individual frames of the set. The registration processor transfers the set of corrected frames 29 and registration error estimates between the frames to the super-resolution processor 23.

Also, the correctly registered frames and the error estimates between the frames are transferred to the SpinAp bandlimited image synthesis processor 26. The SpinAp bandlimited image synthesis processor 26 generates images representative of full circular aperture images by means described by U.S. Pat. No. 5,243,351. The bandlimited SpinAp image is modified to provide the first estimate 33 of the super-resolved scene sample mean.

The current super-resolved scene sample mean estimate 33 and the a priori information of the system response function 37 are used to determine the measurements for each frame that would result from observation of the current scene sample mean estimate 34. The determination of the anticipated measurements 34 is accomplished by convolving the current super-resolved scene sample mean estimate 33 with the system response function of the individual frames 37. The next steps 39 and 40 in the processing chain correspond to dividing the measurements 22, and the anticipated measurements 34 and subtracting unity, which is then convolved 40 with each frame's reflected response function 38. The resulting convolution 40 is summed for each frame 41 and then multiplied 42 by a scaling factor 43. The last steps in the first super-resolved estimates are to exponentiate 44 the output of steps 39 through 43 and multiply 45 the exponentiated result by the current super-resolved scene sample mean estimate 33. The result of steps 21 through 46 is the first true estimate 46 of the SpinAp super-resolved scene. The first true estimate 46 of the SpinAp super-resolved scene is then used to update the current scene sample mean estimate 33, and the process continues for the desired number of iterations.

Figure 9A:
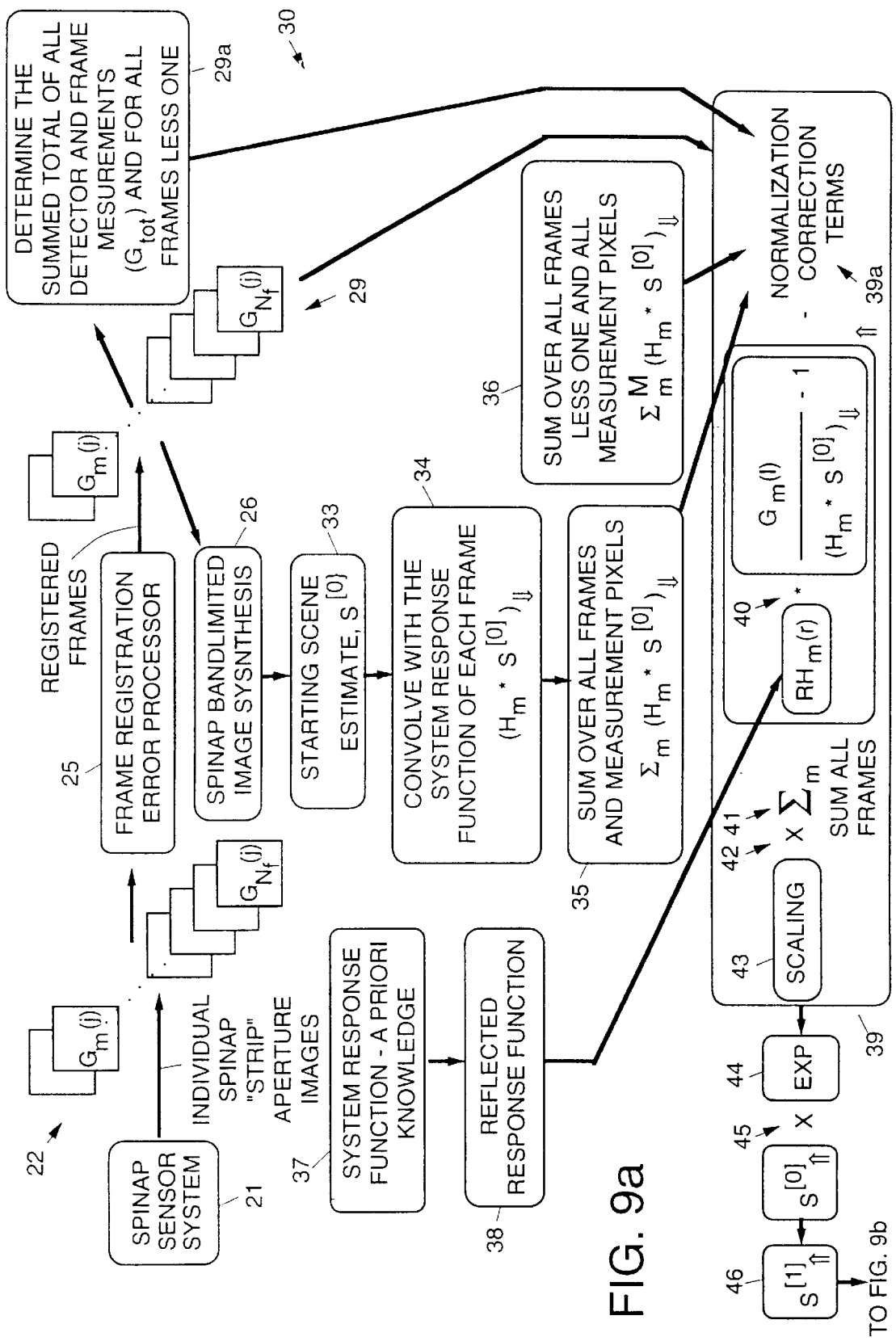
FIGS. 9a and 9b depict another embodiment of another super-resolution processing method associated with the inventions of FIGS. 2–6.
Figure 9B:
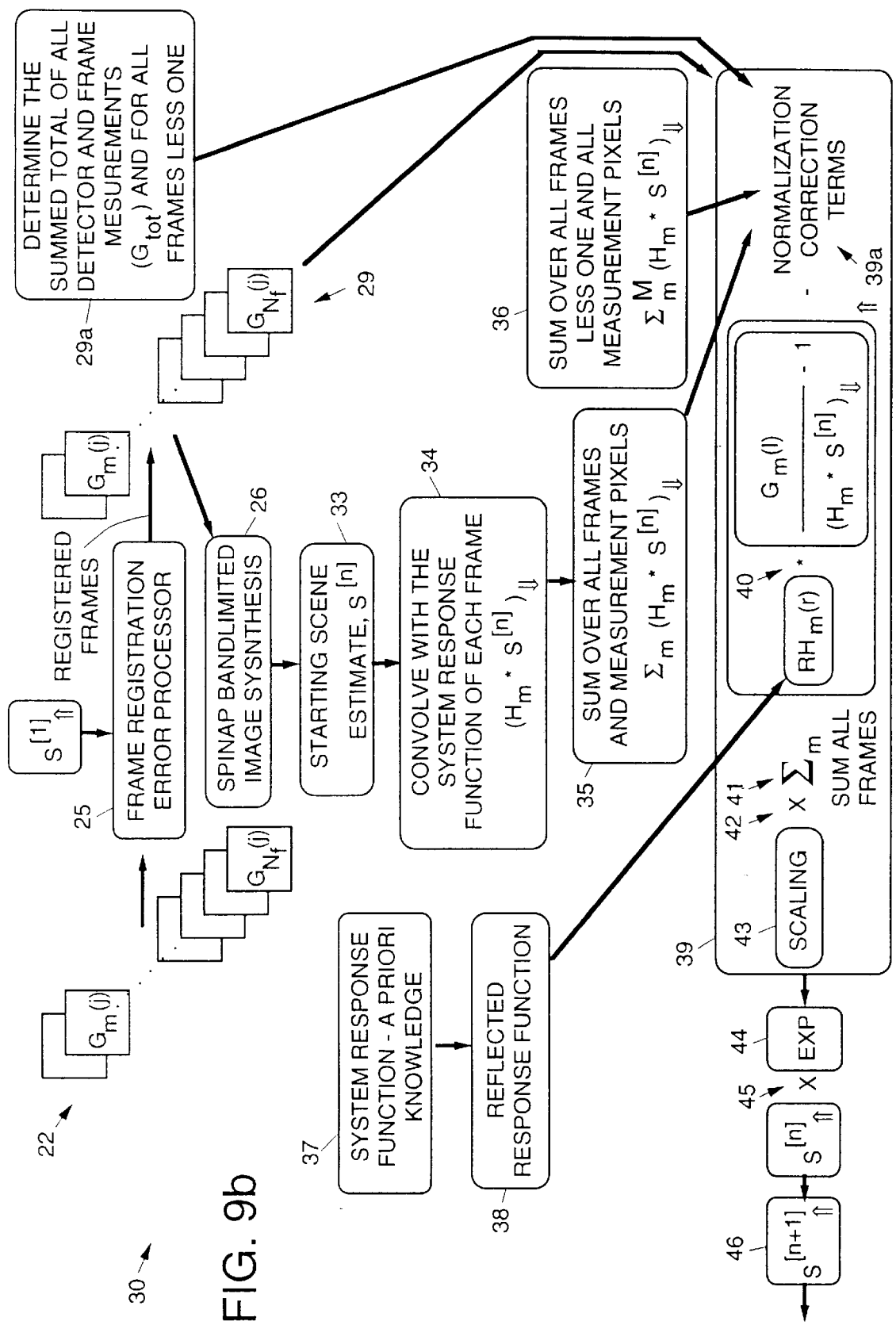

FIGS. 9a and 9b depicts another embodiment of the SpinAp super-resolution processing method used in the systems 10 and methods 30 of FIGS. 2–6. In the method depicted in FIGS. 9a and 9b, the SpinAp sensor 21 acquires and generates a set of strip aperture images 22 that are transferred to the frame registration error processor 25. The frame registration error processor 25 determines the residual registration errors between the individual frames of the set. The registration processor 25 transfers the set of corrected frames 29 and registration error estimates between the frames to the super-resolution processor 23. From the registered frames 29, the SuperSpinAp processor determines 29a the summed total of all detector and frame measurements, and the summed total of all detector measurements over all frame measurements less one. The sums are components of normalized correction terms 39a.

Also, the correctly registered frames and the error estimates between the frames are transferred to the SpinAp bandlimited image synthesis processor 26. The SpinAp bandlimited image synthesis processor 26 generates images representative of full circular aperture images by means described by U.S. Pat. No. 5,243,351. The bandlimited SpinAp image is modified to provide the first estimate 33 of the super-resolved scene.

The current super-resolved scene estimate 33 and the a priori information of the system response function 37 are used to determine the measurements for each frame that would result from observation of the current scene estimate 34. The determination of the anticipated measurements 34 is accomplished by convolving the current super-resolved scene estimate 33 with the system response function of the individual frames 37. The anticipated measurements 34 are also used to determine the summed total 35 of all frames and pixels that would result from the observation of the current scene estimate 33. The anticipated measurements 34 are summed over all pixels over all frames less one and all pixels 36 to produce a component of the normalized correction terms 39a.

The next step 40 in the processing chain corresponds to dividing the measurements 22 and the anticipated measurements 34, which is then convolved with each frame's reflected response function 38. The resulting convolution 40 is summed for each frame 41, then normalization correction terms comprising results from steps 29a, 35 and 36 are subtracted from this sum. This result is multiplied 42 by a scaling factor 43. The last steps in the first super-resolved estimates are to exponentiate 44 the output of steps 39 through 43 and multiply 45 the exponentiated result by the current super-resolved scene estimate 33. The result of steps 21 through 45 is the first true estimate 46 of the SpinAp super-resolved scene. The first estimate of the SpinAp super-resolved scene 46 is then used as the current scene estimate 33, and the process continues for the desired number of iterations.

Figure 10A:
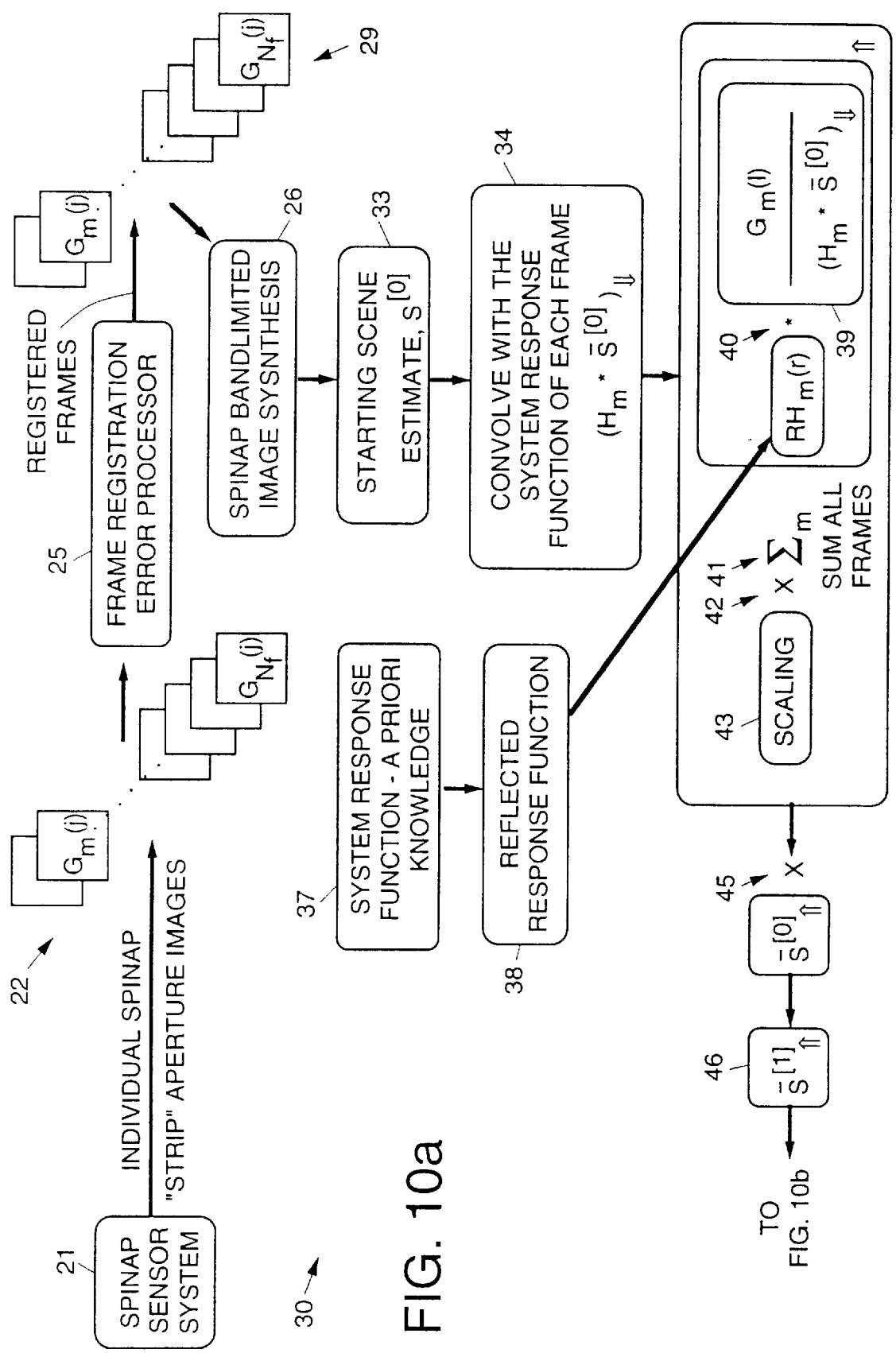
FIGS. 10a and 10b depict another embodiment of another super-resolution processing method associated with the inventions of FIGS. 2–6.
Figure 10B:
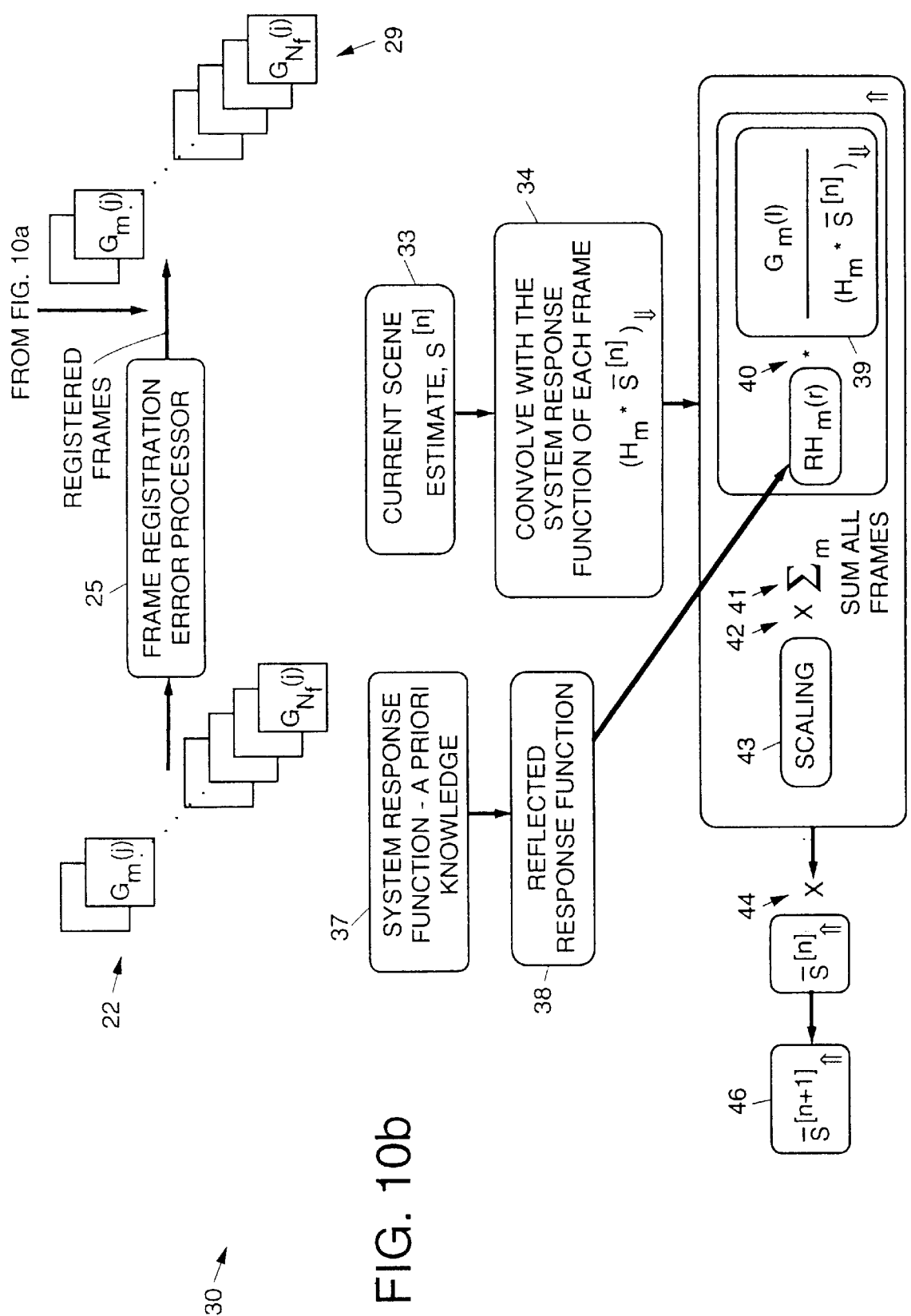

FIGS. 10a and 10b shows another embodiment of the SpinAp super-resolution processing method used in the systems 10 and methods 30 of FIGS. 2–6. In the method of FIGS. 10a and 10b, the SpinAp sensor 21 acquires and generates a set of strip aperture images 22 that are transferred to the frame registration error processor 25. The frame registration error processor 25 determines the residual registration errors between the individual frames of the set. The frame registration error processor 25 transfers the set of corrected frames 29 and registration error estimates between the frames to the super-resolution processor 23.

In addition, the correctly registered frames and the error estimates between the frames are transferred to the SpinAp bandlimited image synthesis processor 26. The SpinAp bandlimited image synthesis processor 26 generates images representative of full circular aperture images by means described by U.S. Pat. No. 5,243,351. The bandlimited SpinAp image is modified to provide the first estimate 33 of the super-resolved scene ensemble mean.

The current super-resolved scene ensemble mean estimate 33 and the a priori information of the system response function 37 are used to determine the measurements for each frame that would result from observation of the current scene ensemble mean estimate 34. The determination of the anticipated measurements 34 is accomplished by convolving the current super-resolved scene ensemble mean estimate 33 with the system response function of the individual frames 37. The next steps 39 and 40 in the processing chain correspond to dividing the measurements 22 and the anticipated measurements 34, which is then convolved 40 with the reflected response function 38 of each frame. The resulting convolution 40 is summed for each frame 41 and then multiplied 42 by a scaling factor 43. The last step in the first super-resolved estimate is to multiply 45 the output of steps 39 through 43 by the current super-resolved scene ensemble mean estimate 34. The result of steps 21 through 45 is the first true estimate 46 of the SpinAp super-resolved scene ensemble mean. The first estimate of the SpinAp super-resolved scene 46 is then used as the current scene ensemble mean estimate 33, and the process continues for the desired number of iterations.

Figure 11A:
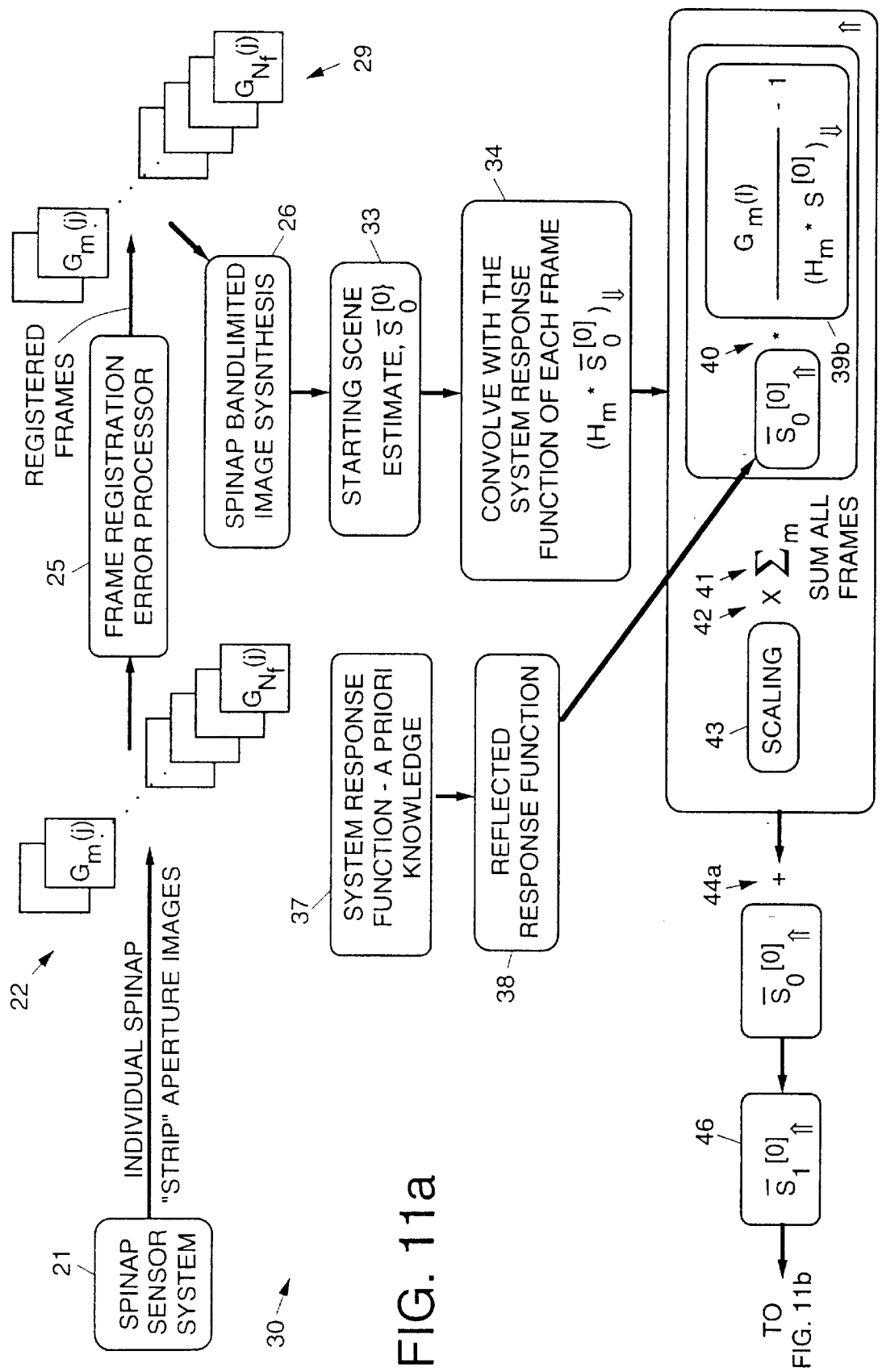
FIGS. 11a and 11b depict another embodiment of another super-resolution processing method associated with the inventions of FIGS. 2–6.
Figure 11B:
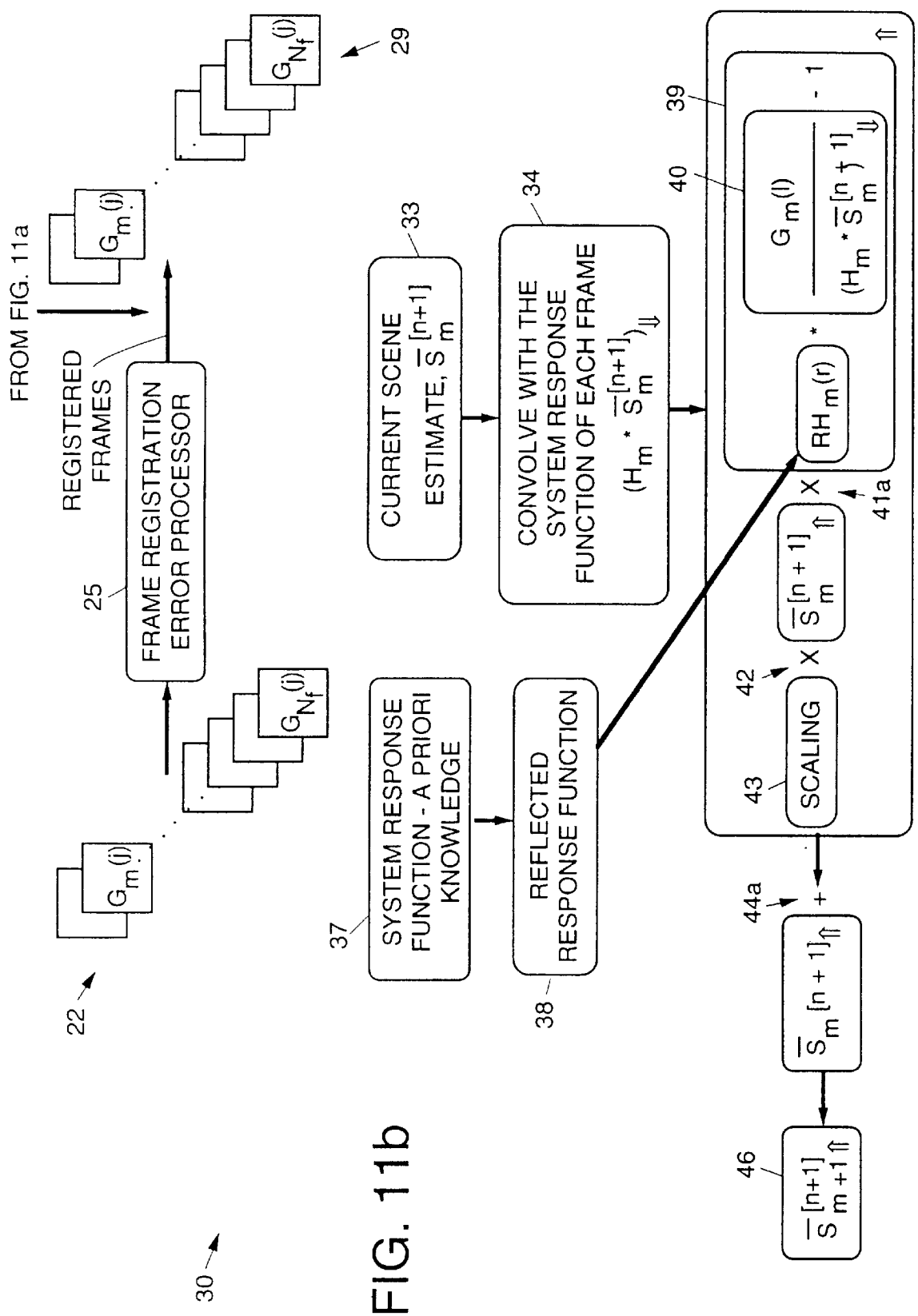

FIGS. 11a and 11b depict another embodiment of the SpinAp super-resolution processing method used in the systems 10 and methods 30 of FIGS. 2–6. In the method shown in FIGS. 11a and 11b, the SpinAp sensor 21 acquires and generates a set of strip aperture images 22, which are transferred to the frame registration error processor 25. The frame registration error processor 25 determines the residual registration errors between the individual frames of the set. The registration processor transfers the set of corrected frames 29 and registration error estimates between the frames to the super-resolution processor 23.

In addition, the correctly registered frames and the error estimates between the frames are transferred to the SpinAp bandlimited image synthesis processor 26. The SpinAp bandlimited image synthesis processor 26 generates images representative of full circular aperture images by means described by U.S. Pat. No. 5,243,351. The bandlimited SpinAp image is modified to provide the first estimate 33 of the super-resolved scene ensemble mean.

The current super-resolved scene ensemble mean estimate 33 and the a priori information of the system response function 37 associated with the first SpinAp frame measurement are used to determine the measurement for the first frame that would result from observation of the current scene ensemble mean estimate 34. The determination of the anticipated measurement 34 is accomplished by convolving the current super-resolved scene ensemble mean estimate 33 with the system response function of the first frame 37. The next steps 39 and 40 in the processing chain correspond to dividing the first SpinAp measurement 22 and the anticipated first measurement 34, which is then convolved 40 with the first frame's reflected response function 38. Unity is subtracted 39b from the resulting convolution and the result is multiplied 41a by the current estimate 34 of the scene ensemble mean. This result is multiplied 42 by a scaling factor 43. The last step in the first super-resolved estimate is to add 44a the output of steps 39 through 43 to the current super-resolved scene ensemble mean estimate 34. The result of steps 21 through 45 is the first true estimate 46 of the SpinAp super-resolved scene ensemble mean. The first estimate 46 of the SpinAp super-resolved scene is then used as the current scene ensemble mean estimate 33, and the process continues for the desired number of iterations.

Super-resolved SpinAp formulations are described below. For temporally stationary scene realizations, denoted by $S_m$, the noise free detector output from the focal plane array of the strip aperture sensor, $G_m$, can be represented as $$G_m = H_m \otimes S_m, \qquad (1)$$

where $\otimes$ denotes the convolution operation. The subscript m denotes the $m^{th}$ rotational orientation of the strip aperture, during which the $m^{th}$ image frame is acquired, and $H_m$ is the total system response function. Sm represents a realization of the scene associated with the $m^{th}$ measurement. This is the most general model of noise-free SpinAp image acquisition.

The discrete form of the convolution of the scene with the system response function can be represented as, $$G_m(j) = \sum_k H_m(j-k) S_m(k), \qquad (2)$$

where j indicates the detector output from location $\bar{r}j$, and the k indicates the discrete scene element geometrically projected to the focal plane spatial position $\bar{r}k$.

The system response function, $H_m$, is the convolution of the optical system point spread function for the $m^{th}$ image acquisition, $PSF_m$, with the individual detector response function, $W_m$, for the $m^{th}$ frame, and is expressed as $$H_m = PFS_m \otimes W_m. \quad (3)$$

$G_m$ can be represented by a column matrix, denoted by $G_m$, with elements corresponding to each of the detector measurements in the focal plane array. $H_m$ can be represented by a two dimensional matrix, denoted by $H_m$, with elements corresponding to the system response function of the electro-optical sensor. Likewise, the scene may be represented as a column matrix, denoted by $S_m$, with elements $S_k$ corresponding to samples of the $m^{th}$ scene realization projected to the super-resolution grid.

One embodiment of the SuperSpinAp processing procedure uses a Bayes estimation approach commonly referred to as maximum a posteriori probability estimation. Maximum a posteriori estimation seeks a value of the unknown object that maximizes the conditional probability of the object given the measurement. A maximum a posteriori approach to SuperSpinAp seeks an estimate of the super-resolved scene that maximizes the probability of the super-resolved scene given the entire set of SpinAp sensor measurements. In this embodiment of SuperSpinAp, the imaging model given in equation 2 is specialized to $$G_m(j) = \sum_k H_m(j-k) S(k), \quad (4)$$

in which the scene, S, is assumed to be a single scene realization during the SpinAp measurement interval.

Applying Bayes rule to the total set of SpinAp measurements yields an expression for the conditional probability of S given the measurements $$p(S \mid G) = \frac{p(G \mid S) p(S)}{p(G)}. \quad (5)$$

G is the total measurement matrix, which is a block column matrix consisting of individual frame measurement matrices, given by $$G = \begin{pmatrix} G_1 \\ G_1 \\ \vdots \\ G_{n_f-1} \\ G_{n_f} \end{pmatrix} \quad (6)$$

where $n_f$ is the total number of frames acquired. S is the matrix of scene samples projected to the super-resolution grid.

Assuming the scene emission, or reflection of photons for each pixel element is statistically independent, the probability density for the one dimensional scene matrix can be expressed as the product of probability density functions associated with each element, i.e., $$P(S) = \prod_k p(S(k)). \quad (7)$$

For scene statistics dominated by the source photon fluctuations, the probability density function of the scene pixel element is postulated to be the Poisson distribution $$P(S(k)) = \frac{\{\overline{S(k)}\}^{S(k)} e^{-\overline{S(k)}}}{S(k)!}, \quad (8)$$

where k is an index designating the projected pixel element of the scene.

For statistically independent frame measurements the joint probability density of the total measurement vector given the scene can be expressed as the product of individual mth frame joint probability densities, $$P(G \mid S) = \prod_m p(G_m \mid S). \quad (9)$$

Likewise, for statistically independent detector measurements the conditional probability of the occurrence of the frame measurement given the scene can be expressed as a product of the individual pixel probability densities conditioned on the scene, $$P(G_m \mid S) = \prod_m p(G_m(j) \mid S). \quad (10)$$

The total measurement conditional probability density is therefore given by the product of pixel and frame measurement probabilities conditioned on the scene, $$P(G \mid S) = \prod_m \prod_j p(G_m(j) \mid S). \quad (11)$$

Assuming the individual detector measurements are a Poisson process, the individual measurement conditional probabilities can be expressed as, $$p(G_m(j) \mid S) = \frac{\left\{\sum_k H_m(j-k) S(k)\right\}^{G_m(j)} e^{-\sum_k H_m(j-k) S(k)}}{G_m(j)!},$$

where $$\sum_k H_m(j-k) S(k)$$

is the mean value of the individual detector measurement.

Since finding the scene that maximizes the conditional probability density is equivalent to finding the scene that maximizes the logarithm of the probability density, solutions for S are sought that maximize $$\ln[p(S \mid G)] = \ln\left[\frac{p(G \mid S) p(S)}{p(G)}\right] = \ln[p(S \mid G)] + \ln[p(S)] - \ln[p(G)]. \quad (12)$$

Recognizing the logarithm of products is the sum of logarithms, the probability of the measurement matrix G given S can be expressed as $$\ln[p(G \mid S)] = \sum_j \sum_m \ln[p(G_m(j) \mid S)]. \quad (13)$$

-continued

Substituting (13) into (12) yields $$\ln[p(S\mid G)] = \sum_m \sum_j \left\{ G_m(j)\ln\left[\sum_k H_m(j-k)S(k)\right] - \right.$$

$$\sum_k H_m(j-k)S(k) - \ln[G_m(j)!] \right\} +$$

$$\sum_k \{S(k)\ln[\overline{S(k)}] - \overline{S(k)}\} -$$

$$\ln[p(S\mid G)] - \sum_k \{\ln[S(k)!]\}.$$

Applying Stirling's approximation $$\ln[x!] \approx x\ln[x] - x, \quad (14)$$

to S(k)! yields $$\ln[p(S\mid G)] \approx \sum_m \sum_j \left\{ G_m(j)\ln\left[\sum_k H_m(j-k)S(k)\right] - \right.$$

$$\sum_k H_m(j-k)S(k) - \ln[G_m(j)!] \right\} + -\ln[p(G)] +$$

$$\sum_k \{S(k)\ln[\overline{S(k)}]\} + \sum_k \{S(k) - \overline{S(k)} - S(k)\ln[S(k)]\}.$$

To determine the value of S(l) that maximizes the conditional probability, the value of S(l) for which the derivative of $\ln[p(S\mid G)]$ vanishes is required. The derivative of $\ln[p(S\mid G)]$ is given by $$\frac{\partial}{\partial S(1)} \ln[p(S\mid G)] \approx$$

$$\sum_m \sum_j \left\{ G_m(j) \frac{H_m(j-1)}{\sum_k H_m(j-k)S(k)} - H_m(j-1) \right\} + \ln[\overline{S(1)}] - \ln[S(1)].$$

Setting the derivative to zero yields the nonlinear equation to be solved for S $$\ln[S(1)] = \ln[\overline{S(1)}] + \sum_m \sum_j \left\{ G_m(j) \frac{H_m(j-1)}{\sum_k H_m(j-k)S(k)} - H_m(j-1) \right\},$$

which after exponentiating and factoring $H_m$ becomes $$S(1) = \overline{S(1)} e^{\sum_m \sum_j \left\{ \frac{G_m(j)}{\sum_k H_m(j-k)S(k)} - 1 \right\} H_m(j-1)}.$$

An iterative procedure, known as Picard's method, may be used to solve for the most probable unknown scene solution of the nonlinear equations. The iterative procedure is described by the equation $$S(1)^{[n+1]} = \overline{S(1)}^{[n]} e^{\sum_m \sum_j \left\{ \frac{G_m(j)}{\sum_k H_m(j-k)S^{[n]}(k)} - 1 \right\} H_m(j-1)} \quad (15)$$

where superscripts [n] and [n+1] refer to current and next scene estimates, respectively.

Since super-resolved SpinAp estimates grid points corresponding to higher spatial frequencies than the original measurement, the iterative process includes remappings between the super-resolution coordinate grid and the measurement (or an intermediate reference) grid. One embodiment of the iterative algorithm accommodates for the differences in sample spacing between the measurement coordinate grids and the super-resolved coordinate grids by performing downsampling of the super-resolution grid by block averaging, and upsampling of the measurement grid by replication. Alternately, the upsampling and downsampling can be implemented using a higher-order interpolation technique. Indicating upsampling by ↓ and downsampling by ○ the iterative solution is given by $$(S(1))^{[n+1]} = S(1)^{[n]} \prod_m e^{\sum_j \left\{ \frac{G_m(j)}{(\sum_k H_m(j-k)S^n(k))^{\Downarrow}} - 1 \right\}^{\Uparrow} H_m(j-1)}.$$

where the exponential sum has been simplified by using $$\exp\left[\sum_m A_m\right] = \prod_m e^{A_m},$$

and the mean value of the current estimate, $\overline{S(1)}^{[n]}$ has been replaced by the current estimate, $S(1)^{[n]}$. A scale factor may be included in the exponential to control convergence.

The previously described SuperSpinAp embodiment uses a maximum a posteriori estimation approach to estimate the scene S. An alternative embodiment uses sample statistics to represent the scene. Since $S_m$ and $G_m$ in equations (1) and (2) are random fields (two-dimensional arrays of random variables), it is possible to analyze the mean values of these random fields. Using <> to denote the sample mean over an ensemble of measurements, the mean value of the convolution can be represented as $$<G_m> = H_m \otimes <S_m>, \quad (16)$$

where the sample mean of the ensemble of scene realizations is expressed as $$\langle S(k)\rangle = \frac{1}{n_f} \sum_{m=1}^{n_f} S_m(k), \quad (17)$$

where $n_f$ is the number of measured SpinAp frames. As in the previous embodiment, maximum a posteriori equations are formulated and Picard's technique is applied to derive an iterative estimation procedure.

In this embodiment, G is defined as in equation 6, and S is analogously defined for the scene realizations.

Assuming the scene emission, or reflection of photons for each pixel element is statistically independent, and that the realizations $S_m$ are statistically independent over the measurement frames, the probability density for the one dimensional scene matrix can be expressed as the product of probability density functions associated with each element, i.e., $$P(S) = \prod_m \prod_k p(S_m(k)). \quad (18)$$

For scene statistics dominated by the source photon fluctuations, the probability density function of the scene pixel element is postulated to be the Poisson distribution $$P(S_m(k)) = \frac{\{\overline{S(k)}\}^{S_m(k)} e^{-\overline{S(k)}}}{S_m(k)!}, \quad (19)$$

where k is an index designating the scene's projected pixel element. The ensemble mean $\overline{S(k)}$ is approximated by the sample mean equation 3a, yielding $$P(S_m(k)) \approx \frac{\left\{\frac{1}{n_f}\sum_p S_p(k)\right\}^{S_m(k)} e^{-\frac{1}{n_f}\sum_p S_p(k)}}{S_m(k)!}, \quad (20)$$

where a dummy index p is used to distinguish counting over frames from a specific frame m.

For statistically independent frame measurements the joint probability density of the total measurement vector given the scene can be expressed as the product of individual mth frame joint probability densities, $$P(G|S) = \prod_m p(G_m|S). \quad (21)$$

Likewise, for statistically independent detector measurements the conditional probability of the occurrence of the frame measurement given the scene can be expressed as a product of the individual pixel probability densities conditioned on the scene, $$P(G_m|S) = \prod_j p(G_m(j)|S). \quad (22)$$

The total measurement conditional probability density is therefore given by the product of pixel and frame measurement probabilities conditioned on the scene, $$P(G|S) = \prod_m \prod_k p(G_m(k)|S). \quad (23)$$

Assuming the individual detector measurements are a Poisson process, the individual measurement conditional probabilities can be expressed as, $$P(G_m(j)|S) = \frac{\{\overline{G(j)}\}^{G_m(j)} e^{-\overline{G(j)}}}{G_m(j)!},$$

where $\overline{G(j)}$ is the ensemble mean value of the individual detector measurement. The ensemble mean is estimated by the sample mean $<G_m(j)>$ in equation 3, yielding the measurement probability density $$P(G_m(j)|S) \approx \frac{\left\{\frac{1}{n_f}\sum_p \sum_k H_m(j-k)S_p(k)\right\}^{G_m(j)} e^{-\frac{1}{n_f}\sum_p \sum_k H_m(j-k)S_p(k)}}{G_m(j)!}.$$

Since finding the scene that maximizes the conditional probability density is equivalent to finding the scene that maximizes the logarithm of the probability density, solutions for S are sought that maximize $$\ln[p(S|G)] = \ln\left[\frac{p(G|S)p(S)}{p(G)}\right] \quad (24)$$

$$= \ln[p(G|S)] + \ln[p(S)] - \ln[p(G)].$$

Recognizing the logarithm of products is the sum of logarithms, the probability of the measurement matrix G given S can be expressed as $$\ln[p(G|S)] = \Sigma_j \Sigma_m \ln[p(G_m(j)|S)]. \quad (25)$$

Substituting equation (25) into equation (24) yields $$\ln[p(S|G)] = \sum_m \sum_j \left\{ G_m(j)\ln\left[\frac{1}{n_f}\sum_p \sum_k H_m(j-k)S_p(k)\right] - \frac{1}{n_f}\sum_p \sum_k H_m(j-k)S_p(k) - \ln[G_m(j)!] \right\} +$$

$$\sum_m \sum_k \left\{ S_m(k)\ln\left[\frac{1}{n_f}\sum_p S_p(k)\right] - \frac{1}{n_f}\sum_p S_p(k) - \ln[S_m(k)!] \right\} -$$

$$\ln[p(G)]$$

Applying Stirling's approximation, $$\ln[x!] \approx x\ln[x] - x, \quad (26)$$

to $S_m(k)!$ yields $$\ln[p(S|G)] = \sum_m \sum_j \left\{ G_m(j)\ln\left[\frac{1}{n_f}\sum_p \sum_k H_m(j-k)S_p(k)\right] - \frac{1}{n_f}\sum_p \sum_k H_m(j-k)S_p(k) - \ln[G_m(j)!] \right\} +$$

$$\sum_m \sum_k \left\{ S_m(k)\ln\left[\frac{1}{n_f}\sum_p S_p(k)\right] - \frac{1}{n_f}\sum_p S_p(k) - \ln[S_m(k)!] \right\} -$$

$$\ln[p(G)]$$

A recursive procedure is derived, in which the $q^{th}$ realization, $S_q$, is estimated and this estimate is used to update the estimate of $<S>$. To determine the value of $S_q(l)$ that maximizes the conditional probability, the value of $S_q(l)$ for which the derivative of $\ln[p(S|G)]$ vanishes is required. The $$\frac{\partial}{\partial S(l)}\ln[p(S|G)] \approx$$

$$\sum_m \sum_j \left\{ G_m(j) \frac{1}{n_f} \frac{H_m(j-l)}{\frac{1}{n_f}\sum_p \sum_k H_m(j-k)S_p(k)} - \frac{1}{n_f}H_m(j-l) \right\} +$$

$$\ln\left[\frac{1}{n_f}\sum_p S_p(l)\right] - \ln[S_q(l)].$$

Setting the derivative to zero yields the

-continued nonlinear equation to be solved for $S_q$ $$\ln[S_q(l)] = \ln\left[\frac{1}{n_f}\sum_p S_q(l)\right] +$$

$$\frac{1}{n_f}\sum_m\sum_j\left\{G_m(j)\frac{H_m(j-l)}{\frac{1}{n_f}\sum_p\sum_k H_m(j-k)S_p(k)} - H_m(j-l)\right\},$$

which after exponentiating and factoring $H_m$ becomes derivative of $\ln[p(S|G)]$ is given by $$S_q(l) = \langle S(l)\rangle e^{\frac{1}{n_f}\sum_m\sum_j\left\{\frac{G_m(j)}{\frac{1}{n_f}\sum_p\sum_k H_m(j-k)S_p(k)}-1\right\}H_m(j-l)}.$$

An iterative procedure, known as Picard's method, can be used to solve for the most probable unknown scene solution of the nonlinear equations. The iterative procedure is described by the equation $$S_q(l)^{[n+1]} = \langle S(l)\rangle^{[n]} e^{\frac{1}{n_f}\sum_m\sum_j\left\{\frac{G_m(j)}{(\Sigma_k H_m(j-k)\langle S\rangle^n(k))^{\parallel}}-1\right\}^\uparrow H_m(j-l)}, \quad (27)$$

where the superscript [n] and [n+1] refer to the current and next scene estimates, respectively. As in the previous embodiment, upsampling (denoted by ○) and downsampling (denoted by ↓) can be used to accommodate the differences in sample spacing between the measurement coordinate grids and the super-resolved coordinate grids.

A maximum a posteriori approach using a single probability density accommodating the total measurements is described below. The algorithmic procedure just described essentially has two unknowns that must be determined, the super-resolved scene pixel and the super-resolved scene pixel's mean value. Implementing the algorithm associated with the first set of super-resolved scene estimation equations incorporated an ad hoc procedure to estimate the scene pixel's mean value. Implementing the algorithm associated with the second set of super-resolved scene estimation equations uses sample statistics to approximate the ensemble mean for each scene pixel.

An alternative approach recognizes the total number of independent random variables to be a constant, i.e., the summed total of all measurements or the summed total of a fraction of the measurements is a random variable conditioned upon the individual measurements.

Therefore, a Bayes criteria is sought that maximizes the conditional probability of the super-resolved scene given the summed total of the measurements and the set of measurements less one. The nomenclature for the alternate procedure is identical to the first embodiment described herein.

For scene and measurement statistics dominated by the photon fluctuations, the probability density functions for the individual scene and measurement elements are postulated to be Poisson, i.e.

$$P(S(k_\uparrow)) = \frac{\{\overline{S(k_\uparrow)}\}^{S(k_\uparrow)} e^{-\overline{S(k_\uparrow)}}}{S(k_\uparrow)!},$$

and $$P(G_m(k_\downarrow)) = \frac{\{\overline{G_m(j_\downarrow)}\}^{G_m(j_\uparrow)} e^{-\overline{G_m(j_\downarrow)}}}{G_m(j_\downarrow)!},$$

where $\overline{S(k_\circ)}$ is the scene's $k_\circ^{th}$ projected "pixel's" mean value, and $G_m(k_\downarrow)$ is the $j^{th}$ detectors measurement from frame m.

For n statistically independent Poisson random variables, $X_1 \ldots X_n$, having mean values $\overline{X_1}$ and individual Poisson distributions $$p(X_k) = \frac{\{\overline{X_k}\}^{X_k} e^{-\overline{X_k}}}{X_k!},$$

the summation of the Poisson random variables, $$X_{tot} = \sum_{i=1}^n X_i,$$

is also a Poisson random variable having a distribution given by F. A. Haight, in Handbook of the Poisson Distribution, page 71, $$p(X_{tot}) = \frac{\{\overline{X_{tot}}\}^{X_{tot}} e^{-\overline{X_{tot}}}}{X_{tot}!},$$

$$\overline{X_{tot}} = \sum_{i=1}^n \overline{X_i}.$$

For n statistically independent Poisson random variables, $X_1 \ldots X_n$, having mean values $\overline{X_1} \ldots \overline{X_n}$, individual Poisson distributions, $p(X_k)$, the conditional probability distribution of $X_1, \ldots X_{n-2}, X_{n-1}$ given the summed total of random variables, $$X_{tot} = \sum_{i=1}^n X_i,$$

is multinomial and is given by F. A. Haight, in "Handbook of the Poisson Distribution", page 71, $$p(X_1 \ldots X_{n-2}, X_{n-1} | X_{tot}) = \qquad (28)$$

$$\frac{X_{tot}!\left[\prod_{i=1}^{n-1}\left(\frac{\overline{X_i}}{\overline{X_{tot}}}\right)^{X_i}\right]\left[1-\sum_{i-1}^{n-1}\frac{\overline{X_i}}{\overline{X_{tot}}}\right]^{(X_{tot}-\Sigma_{i=1}^n X_i)}}{\left[\prod_{i=1}^{n-1}(\overline{X_i}!)\left(X_{tot}-\sum_{i=1}^n X_i\right)!\right]}$$

Application of equation (28) to the set of SuperSpinAp measurements depends upon selecting the measurement not explicitly present in the conditional probability. Since the numbering of the measurements is arbitrary, the conditional probability of the measurements given the summed total of measurements is expressed as p(G₁(1), . . . ,GM(1); G₁(2), . . . ,G$_M$(2); . . . G₁(N), . . . ,G$_M$(N)|G$_{tot}$)

where M=number of frames, if N is the number of detections per frame minus 1, or M=the number of frames minus 1, if N is the number of detections per frame, and $$G_{tot} \equiv \sum_m \sum_j G_m(j).$$

Regarding any subset of data, $$p(G_1(1), \ldots, G_M(1); G_1(2), \ldots, G_M(2); \ldots G_1(N), \ldots, G_M(N); | G_{tot}) =$$

$$\frac{\left[\prod_{m=1,j=1}^{M,N} \left(\frac{\overline{G_m(j)}}{\overline{G_{tot}}}\right)^{G_m(j)}\right] \left[1 - \sum_{m=1,j=1}^{M,N} \frac{\overline{G_m(j)}}{\overline{G_{tot}}}\right]^{\left(G_{tot} - \sum_{m=1,j=1}^{M,N} G_m(j)\right)}}{\left[\prod_{m=1,j=1}^{M,N} (\overline{G_m(j)}!)\right] \left[\left(G_{tot} - \sum_{m=1,j=1}^{M,N} \overline{G_{tot}}\right)!\right]} \cdot G_{tot}!$$

Recognizing the total number of independent random variables are constant, i.e. the summed total of all measurements or the summed total of a fraction of the measurements is a random variable conditioned upon the individual measurements, provides a means to establish another modified self consistent maximum a posteriori approach to finding an estimate of the super-resolved scene. The Bayes estimation rule for the super-resolved scene given the total measurement and a set of measurements less one is $$p(S | G_-, G_{tot}) = \frac{p(G_-, G_{tot} | S) p(S)}{p(G_-, G_{tot})},$$

where $G_-$ is a block matrix corresponding to the total set less one of the measurements and S is the matrix of scene samples projected to the super-resolution grid. The elements of the matrix $G_-$ correspond to the set $$(G_1(1), \ldots, G_M(1); G_1(2), \ldots, G_M(2); \ldots G_i(N), \ldots, G_M(N)),$$

where M=the number of frames if N=the number of detections per frame minus 1; or M=the number of frames minus 1 if N=the number of detections per frame.

The self consistency requirement is once again incorporated by assuming the mean values of the individual detector measurements, and the mean value of the sum total of SpinAp measurements correspond to the noise free set of measurements i.e.

$$\overline{G_m(j\downarrow)} = H_m \otimes S = \sum_{k\uparrow} H_m(j\downarrow - k\uparrow) S(k\uparrow) \quad (29)$$

$$\overline{G_{tot}} = H_m \otimes S = \sum_m \sum_{j\downarrow} \sum_{k\uparrow} H_m(j\downarrow - k\uparrow) S(k\uparrow). \quad (30)$$

The $\circ$ and $\downarrow$ indicate the super-resolved and measurement coordinate spatial grids.

Since the imaging sensor measurements correspond to the detection of photons propagated from the scene, the scene's estimated values must be positive. Therefore, an additional self consistency requirement is $$S \geq 0, \quad (31)$$

which is implicitly satisfied by the embodiments of the super-resolution algorithms.

Determining the maxima of the probability densities is equivalent to determining the maxima of $\ln[p(S|G_-, G_{tot})]$.

The individual measurements are assumed to be statistically independent Poisson random variables, and the mean value of the individual measurements as well as the summed value of all or part of the total measurements summed are assumed to be Poisson random variables. In addition, the mean values of the Poisson random variables are assumed to be the noise free measurement, i.e. the mean value of the summed total SpinAp measurements is $$p(G_1(1), \ldots, G_M(1); G_1(2), \ldots, G_M(2); \ldots G_1(N), \ldots, G_M(N); | G_{tot}) =$$

$$G_{tot}! \cdot \frac{\left[\prod_{m=1,j\downarrow=1}^{M,N} \left(\frac{\sum_{k\uparrow} H_m(j\downarrow - k\uparrow) S(k\uparrow)}{\sum_m \sum_{j\downarrow} \sum_{k\uparrow} H_m(j\downarrow - k\uparrow) S(k\uparrow)}\right)^{G_m(j\downarrow)}\right] \cdot}{\left[\prod_{m=1,j\downarrow=1}^{M,N} (H_m(j\downarrow - k\uparrow) S(k\uparrow)!)\right] \left(G_{tot} - \sum_{m=1,j\downarrow=1}^{M,N} G_m j\downarrow\right)!}$$

$$\left[1 - \sum_{m=1,j\downarrow=1}^{M,N} \frac{\sum_{k\uparrow} H_m(j\downarrow - k\uparrow) S(k\uparrow)}{\sum_m \sum_{j\downarrow} \sum_{k\uparrow} H_m(j\downarrow - k\uparrow) S(k\uparrow)}\right]^{\left(G_{tot} - \sum_{m=1,j\downarrow=1}^{M,N} G_m(j\downarrow)\right)}$$

and the mean value of the individual detector measurements is $$\ln[p(S|G_-, G_{tot})] \approx -\ln[p(G_-, G_{tot})] + G_{tot} \ln[G_{tot}] - G_{tot} +$$

$$\sum_{k\uparrow} \{S(k\uparrow) \ln[\overline{S(k\uparrow)}] - [\overline{S(k\uparrow)}] - S(k\uparrow) \ln[S|k\uparrow]\} + S(k\uparrow)\} +$$

$$\left(\sum_{m=1,j\downarrow=1}^{M,N} G_m(j\downarrow)\right) \ln \sum_{k\uparrow} H_m(j\downarrow - k\uparrow) S(k\uparrow) +$$

$$-\left(\sum_{m=1,j\downarrow=1}^{M,N} G_m(j\downarrow)\right) \ln \sum_{m_1,j_{1\downarrow},k_{1\uparrow}}^{ALL} H_{m_1}(j_{1\downarrow} - k_{1\uparrow}) S(k_{1\uparrow}) +$$

$$\left(G_{tot} - \sum_{m=1,j\downarrow=1}^{M,N} G_m(j\downarrow)\right) \ln \left[1 - \frac{\sum_{m=1,j\downarrow=1}^{M,N} \sum_{k\uparrow} H_m(j\downarrow - k\uparrow) S(k\uparrow)}{\sum_{m_1=1,j_{1\downarrow}=1}^{ALL} H_{m_1}(j_{1\downarrow} - k_{1\uparrow}) S(k_{1\uparrow})}\right] +$$

$$-\sum_{m=1,j\downarrow=1}^{M,N} (G_m(j\downarrow) | \ln[G_m(j\downarrow)] - G_m(j\downarrow)) +$$

$$-\left\{\left(G_{tot} - \sum_{m=1,jl_\downarrow=1}^{ALL} G_{ml}(j\downarrow)\right) \ln \left[G_{tot} - \sum_{m_1=1,jl_\downarrow=1}^{ALL} G_{ml}(j\downarrow)\right] - \right.$$

$$\left. \left(G_{tot} - \sum_{m=1,j\downarrow=1}^{M,N} G_m(j\downarrow)\right)\right\}$$

Therefore, substituting the mean values into the multinomial distribution for the probability of the measurements given the summed total measurement yields the corresponding probability also conditioned on the occurrence of the scene, i.e.

$$p(G_1(1), \ldots, G_M(1); G_1(2), \ldots, G_M(2); \ldots G_1(N), \ldots, G_M(N); | G_{tot}) =$$

-continued $$G_{tot}! \cdot \frac{\left[\prod_{m=1,j_\downarrow=1}^{M,N}\left(\frac{\sum_{k_\uparrow}H_m(j_\downarrow-k_\uparrow)S(k_\uparrow)}{\sum_m\sum_{j_\downarrow}\sum_{k_\uparrow}H_m(j_\downarrow-k_\uparrow)S(k_\uparrow)}\right)^{G_m(j_\downarrow)}\right]\left[1-\sum_{m=1,j_\downarrow=1}^{M,N}\frac{\sum_{k_\uparrow}H_m(j_\downarrow-k_\uparrow)S(k_\uparrow)}{\sum_m\sum_{j_\downarrow}\sum_{k_\uparrow}H_m(j_\downarrow-k_\uparrow)S(k_\uparrow)}\right]^{(G_{tot}-\sum_{m=1,j_\downarrow=1}^{M,N}G_m(j_\downarrow))}}{\left[\prod_{m=1,j_\downarrow=1}^{M,N}(H_m(j_\downarrow-k_\uparrow)S(k_\uparrow)!)\right]\left(G_{tot}-\sum_{m=1,j_\downarrow=1}^{M,N}G_mj_\downarrow\right)!}$$

Since the logarithm of products is the sum of logarithms, the logarithm of the measurements conditioned on the scene is $$ln[p(S|G_-,G_{tot})] = ln[p(G_-,G_{tot}|S)] + ln[p(S)] - ln[p(G_-,G_{tot})].$$

Applying the Stirling approximation to the statistics for the projected pixels in the super-resolved scene, recognizing the logarithm of products is the sum of logarithms, and substituting the appropriate probability distributions into the logarithm of Bayes theorem, yields $$\ln[p(S|G_-,G_{tot})] \approx -\ln[p(G_-,G_{tot})] + G_{tot}\ln[G_{tot}] - G_{tot} +$$

$$\sum_{k_\uparrow}\left\{S(k_\uparrow)\ln[\overline{S(k_\uparrow)}] - [\overline{S(k_\uparrow)}] - S(k_\uparrow)\ln[S|k_\uparrow]\right\} + S(k_\uparrow)\right\} +$$

$$\left(\sum_{m=1,j_\downarrow=1}^{M,N}G_m(j_\downarrow)\right)\ln\sum_{k_\uparrow}H_m(j_\downarrow - k_\uparrow)S(k_\uparrow) +$$

$$-\left(\sum_{m=1,j_\downarrow=1}^{M,N}G_m(j_\downarrow)\right)\ln\sum_{m_1,j_{1\downarrow},k_{1\uparrow}}^{ALL}H_{m_1}(j_{1\downarrow} - k_{1\uparrow})S(k_{1\uparrow}) +$$

$$\left(G_{tot} - \sum_{m=1,j_\downarrow=1}^{M,N}G_m(j_\downarrow)\right)\ln\left[1 - \frac{\sum_{m=1,j_\downarrow=1}^{M,N}\sum_{k_\uparrow}H_m(j_\downarrow - k_\uparrow)S(k_\uparrow)}{\sum_{m_1=1,j_{1\downarrow}=1}^{ALL}H_{m_1}(j_{1\downarrow} - k_{1\uparrow})S(k_{1\uparrow})}\right] +$$

$$-\sum_{m=1,j_\downarrow=1}^{M,N}(G_m(j_\downarrow)\ln[G_m(j_\downarrow)] - G_m(j_\downarrow)) +$$

$$-\left\{\left(G_{tot} - \sum_{m=1,j_\downarrow=1}^{ALL}G_{ml}(j_\downarrow)\right)\ln\left[G_{tot} - \sum_{m_1=1,j_{1\downarrow}=1}^{ALL}G_{ml}(j_\downarrow)\right] - \left(G_{tot} - \sum_{m=1,j_\downarrow=1}^{M,N}G_m(j_\downarrow)\right)\right\}$$

Since the maximum a posteriori embodiment of Super-SpinAp depends upon finding the super-resolved scene that maximizes the conditional probabilities, scene estimates are sought which solve the nonlinear partial differential equations resulting from the differentiation of the logarithm of the conditional probability, i.e.

$$\frac{\partial}{\partial S(l\uparrow)}\ln[p(S|G_-,G_{tot})] = 0.$$

As with the previous approaches, the solution for the super-resolved scene must satisfy a set of nonlinear coupled equations generated by requiring the derivative of the conditional probability with respect to the scene super-resolved pixel to vanish. The set of simultaneous equations for the embodiment described in this section are:

$$\ln[S(q_\uparrow)] = \ln[\overline{S(q_\uparrow)}] + \sum_{m=1,j_\downarrow=1}^{M,N}G_m(j_\downarrow)\frac{H_m(j_\downarrow - q_\uparrow)}{\sum_{k_\uparrow}H_m(j_\downarrow - k_\uparrow)S(k_\uparrow)} +$$

$$-\left(\sum_{m=1,j_\downarrow=1}^{M,N}G_m(j_\downarrow)\right)\frac{\sum_{m_1,j_{1\downarrow}}^{ALL}H_{ml}(j1_\downarrow - q_\uparrow)}{\sum_{m_1,j_{1\downarrow},k_{1\uparrow}}^{ALL}H_{ml}(j1_\downarrow - kl_\uparrow)S(kl_\uparrow)} -$$

$$\left(G_{tot} - \sum_{m=1,j_\downarrow=1}^{M,N}G_m(j_\downarrow)\right)$$

$$\left[\frac{\left(\sum_{m=1,j_\downarrow=1}^{M,N}H_{ml}(j1_\downarrow - q_\uparrow)\right)\left(\sum_{m_1,j_{1\downarrow},k_{1\uparrow}}^{ALL}H_{ml}(j1_\downarrow - kl_\uparrow)S(kl_\uparrow)\right)}{\left(\sum_{m_l,j_{1\downarrow},k_{1\uparrow}}^{ALL}H_{ml}(j1_\downarrow - kl_\uparrow)S(kl_\uparrow)\right)^2} + \right.$$

$$\left. -\frac{\left(\sum_{m_l,j_{1\downarrow}}^{ALL}H_{ml}(j1_\downarrow - q_\uparrow)\right)\left(\sum_{m=1,j_\downarrow=1}^{M,N}\sum_{k_\uparrow}H_m(j_\downarrow - k_\uparrow)S(k_\uparrow)\right)}{\left(\sum_{m_l,j_{1\downarrow},k_{1\uparrow}}^{ALL}H_{ml}(j1_\downarrow - kl_\uparrow)S(kl_\uparrow)\right)^2}\right]$$

$$\left[1 - \frac{\sum_{m=1,j_\downarrow=1}^{M,N}\sum_{k_\uparrow}H_{ml}(j1_\downarrow - kl_\uparrow)S(k_\uparrow)}{\sum_{m_l,j_{1\downarrow},k_{1\downarrow}}^{ALL}H_{ml}(j1_\downarrow - kl_\uparrow)S(k_\uparrow)}\right]$$

The numerical solution of the set of simultaneous equations can proceed by exponentiation and applying, the iterative method of Picard.

A summed measurement super-resolution embodiment will now be described. In this super-resolved SpinAp embodiment, an additional set of super-resolution equations is established based on the total number of measured photons in the SpinAp frames. The super-resolved scene value is determined by requiring the estimated scene value to be an extrema of the conditional probability density for the scene value given the occurrence of the total measurements, as well as an extrema of the conditional probability density for the scene value given the measured SpinAp frames. The two sets of equations can then be used to eliminate the unknown mean pixel value, leaving a set of nonlinear equations for the super-resolved scene pixel value. The set of nonlinear equations may be solved using the method of Picard. Details of the procedures leading to the definition of this alternate super-resolution procedure are described below An alternative approach embodying noiseless measurement will now be described. As with the first version of the SpinAp super-resolution algorithm derivation, the noise free image measurement is represented as a convolution of the sensors system response function, $H_m$, with the observed scene, S, or $$G_m = H_m \otimes S,$$

where $\otimes$ refers to the convolution operation. The discrete form of the $m^{th}$ frame's noise free image measurement, and the total of all detector noise free measurements for all of the frames will be expressed as $$G_m(j) = \sum_k H_m(j-k)S(k) \quad \text{and}$$

$$G_{tot}(j) = \sum_m \sum_j G_m(j)$$

In the previous equations, j is a one dimensional index associated with the detector location vector $\bar{r}_j$, and k is a one dimensional index associated with the detector location vector $\bar{r}_k$.

For isoplanatic optical systems and spatially uniform response focal plane array detectors, the $m^{th}$ frame's system response function may be represented as the convolution of the optical system's point spread function $PSF_m$ with the individual detector response function $W_m$ or $$SRF_m = PSF_m \otimes W_m \equiv H_m$$

The modified maximum a posteriori approach uses two different Bayes probability rules to find an estimate of the super-resolved scene. The two Bayes rules, $$p(S|G) = \frac{p(G|S)p(S)}{p(G)}, \quad \text{and}$$

$$p(S|G_{tot}) = \frac{p(G_{tot}|S)p(S)}{p(G_{tot})},$$

correspond to the probability the super-resolved scene occurs given the total set of SpinAp measurements, and the probability the super-resolved scene occurs given the sum of all the SpinAp measurements has occurred, respectively. As defined previously, G is the total measurement matrix, which is a block column matrix consisting of individual frame measurement matrices, and S a column matrix consisting of individual scene elements projected to the super resolution coordinate grid, or $$G = \begin{pmatrix} G_1 \\ G_2 \\ \vdots \\ G_{n_f-1} \\ G_{n_f} \end{pmatrix}, \quad \text{and}$$

$$S = \begin{pmatrix} S_1 \\ S_2 \\ \vdots \\ S_{n_{pixel}} \end{pmatrix}$$

where $n_f$ is the total number of measurements frames, and $n_{pixel}$ is the total number of super-resolved points in the estimate of the super-resolved scene.

The self consistent super-resolution approach incorporating the conditional probability for the total measurement given the scene seeks an estimate for the scene, S, that maximizes the conditional probability for the scene given the complete set of SpinAp measurements, and also maximizes the conditional probability for the scene given the sum of all SpinAp measurements, i.e. a solution for S is sought that simultaneously maximizes $p(S|G)$ and $p(S|G_{tot})$. For general distributions, an extrema solution satisfying both conditions may not be possible, however, the procedures and statistical postulates described in the following sections permit a solution in terms of a nonlinear set of equations.

The self consistency requirement is incorporated by assuming the mean values of the individual detector measurements, and the mean value of the sum total of SpinAp measurements correspond to the noise free set of measurements, i.e.

$$\overline{G_m(j_\downarrow)} = H_m \otimes S = \sum_{k_\uparrow} H_m(j_\downarrow - k_\uparrow)S(k_\uparrow) \tag{32}$$

$$\overline{G_{tot}} = \sum_m \sum_{j_\downarrow} \sum_{k_\downarrow} H_m(j_\downarrow - k_\uparrow)S(k_\uparrow). \tag{33}$$

The $\circ$ and $\downarrow$ indicate the super-resolved and "measurement" coordinate spatial grids.

Since the imaging sensor measurements correspond to the detection of photons propagated from the scene, the scene's estimated values must always be positive. Therefore, an additional self consistency requirement is $$S \geq 0, \tag{34}$$

which is implicitly satisfied by the above-described super-resolution algorithms.

Since the logarithm is a monatomic function, determining the maxima of the probability densities is equivalent to determining maxima of $\ln p(S|G)$ and $\ln p(S|G_{tot})$. Applying the logarithm to Bayes theorem, maxima for $$\ln[p(S|G)] = \ln\left[\frac{p(G|S)p(S)}{p(G)}\right]$$

and $$\ln[p(S|G_{tot})] = \ln\left[\frac{p(G_{tot}|S)p(S)}{p(G_{tot})}\right]$$

are sought.

For statistically independent frame measurements the joint probability density of the total measurement vector given the scene can be expressed as the product of individual $m_{th}$ frame joint probability densities, $$p(G|S) = \prod_m p(G_m|S).$$

Likewise, for statistically independent detector measurements the conditional probability of the occurrence of the frame measurement given the scene can be expressed as a product of the individual pixel probability densities conditioned on the scene $$p(G_m|S) = \prod_{j_1} p(G_m(j_\downarrow)|S).$$

The total measurement conditional probability density is therefore given by the product of pixel and frame measurement probabilities conditioned on the scene, $$p(G|S) = \prod_m \prod_{j_\downarrow} p(G_m(j_\downarrow)|S).$$

Assuming the scene emission, or reflection of photons for each pixel element is statistically independent, the probability density for the one dimensional scene matrix can be expressed as the product of probability density functions associated with each element, i.e., $$p(S) = \prod_{k_\uparrow} p(S(k_\uparrow)).$$

For scene statistics dominated by the source photon fluctuations, the probability density function of the scene pixel element is postulated to be $$P(S(k_\uparrow)) = \frac{\{\overline{S(k_\uparrow)}\}^{S(k_\uparrow)} e^{-\overline{S(k_\uparrow)}}}{S(k_\uparrow)!}$$

where $\overline{S(k_\circ)}$ is the scene's k$\mathbf{l}^{th}$ projected "pixel's" mean value.

Assuming the individual detector measurements are also a Poisson random process implies the individual detector measurement probability density function is $$P(S(k_\uparrow)) = \frac{\{\overline{S(k_\uparrow)}\}^{S(k_\uparrow)} e^{-\overline{S(k_\uparrow)}}}{S(k_\uparrow)!}$$

Substituting the m$^{th}$ frame measurement's j$\mathbf{l}^{th}$ "pixel's" mean value $$G_m(j_\downarrow) = \sum_{k_\uparrow} H_m(j_\downarrow - k_\uparrow) S(k_\uparrow)$$

yields an expression for the probability of the detector measurement given the scene $$P(G_m(j_\downarrow)|S) = \frac{\left(\sum_{k_\uparrow} H_m(j_\downarrow - k_\uparrow) S(k_\uparrow)\right)^{G_m(j_\downarrow)} e^{-\sum_{k_\uparrow} H_m(j_\downarrow - k_\uparrow) S(k_\uparrow)}}{G_m(j_\downarrow)!}.$$

Since the sum of statistically independent Poisson random variables is also a Poisson random variable the summed total of all the SpinAp detector probabilities is Poisson random variable and is given by $$p(G_{tot}) = \frac{\{\overline{G_{tot}}\}^{G_{tot}} e^{\overline{G_{tot}}}}{G_{tot}!}.$$

Substituting the mean value or the summed total SpinAp measurements, $$G_{tot} = \sum_m \sum_{j_\downarrow} \sum_{k_\downarrow} H_m(j_\downarrow - k_\uparrow) S(k_\uparrow),$$

into the Poisson probability density, yields the conditional probability of $G_{tot}$ given S has occurred $$p(G_{tot}|S) = \frac{\sum_m \sum_{j_\downarrow} \sum_{k_\downarrow} H_m(j_\downarrow - k_\uparrow)(S(k_\uparrow))^{G_{tot}} \left(e^{-\Sigma_m \Sigma_{j_\downarrow} \Sigma_{k_\uparrow} H_m(j_\downarrow - k_\uparrow) S(k_\uparrow)}\right)}{G_{tot}!}.$$

Since the logarithm of products is the sum of logarithms, the logarithm of the measurements conditioned on the scene is $$\ln[p(S|G)] = \sum_{j_\downarrow} \sum_m \ln[p(G_m(j_\downarrow)|S)].$$

Likewise, the logarithm of the scene probability density is $$\ln[p(S)] = \sum_{k_\uparrow} \ln[p(S(k_\uparrow))].$$

Substituting the previous equations into the conditional probability for the set of scene measurements given the scene yields $$\ln[p(S|G)] = \ln[p(G|S)] + \ln[p(S)] - \ln[p(G)] =$$

$$\sum_m \sum_{j_\downarrow} \left\{ G_m(j_\downarrow) \ln \sum_{k_\uparrow} H_m(j_\downarrow - k_\uparrow) S(k_\uparrow) - \sum_{k_\uparrow} H_m(j_\downarrow - k_\uparrow) S(k_\uparrow) \right\} -$$

$$\sum_m \sum_{j_\downarrow} \{\ln [G_m(j_\downarrow)!]\} - \ln[p(G)] +$$

$$\sum_{k_\uparrow} \{S(k_\uparrow) \ln[\overline{S(k_\uparrow)}] - \overline{S(k_\uparrow)} - \ln[S(k_\uparrow)!]\}.$$

Determining the logarithm of $p(S|G_{tot})$ depends upon determining the logarithm of the conditional probability of the summed total measurement given the scene, $$\ln[p(G_{tot}|S)] = G_{tot} \ln\left[\sum_m \sum_{j_\downarrow} \sum_{k_\downarrow} H_m(j_\downarrow - k_\uparrow) S(k_\uparrow)\right] -$$

$$\sum_m \sum_{j_\downarrow} \sum_{k_\downarrow} H_m(j_\downarrow - k_\uparrow) S(k_\uparrow) - \ln[p(G_{tot})!].$$

Substituting into Bayes theorem for the relationship of the conditional probabilities, yields $$\ln[p(S|G_{tot})] = \ln[p(G_{tot}|S)] + \ln[p(S)] - \ln[p(G_{tot})]$$

$$= G_{tot} \ln\left[\sum_m \sum_{j_\downarrow} \sum_{k_\uparrow} H_m(j_\downarrow - k_\uparrow) S(k_\uparrow)\right] +$$

$$-\sum_m \sum_{j_\downarrow} \sum_{k_\uparrow} H_m(j_\downarrow - k_\uparrow) S(k_\uparrow) - \ln[(G_{tot}!)] +$$

$$-\ln[p(G_{tot})] +$$

$$\sum_{k_\uparrow} \{S(k_\uparrow) \ln[\overline{S(k_\uparrow)}] - \overline{S(k_\uparrow)} - \ln[S(k_\uparrow)!]\}$$

For photon counts greater than approximately 50 photons, the Stirling approximation $$ln[x!] \approx x ln[x] - x,$$

may be used to simplify the calculation procedure. The Stirling approximation applied to the two conditional probabilities of interest yields, $$\ln[p(S|G)] = \ln[p(G|S)] + \ln[p(S)] - \ln[p(G)]$$

$$= \sum_m \sum_{j_\downarrow} \left\{ G_m(j_\downarrow) \ln \sum_{k_\uparrow} H_m(j_\downarrow - k_\uparrow) S(k_\uparrow) \right.$$

$$\left. - \sum_{k_\uparrow} H_m(j_\downarrow - k_\uparrow) S(k_\uparrow) \right\} -$$

$$\sum_m \sum_{j_\downarrow} \{\ln[G_m(j_\downarrow)!]\} - \ln[p(G)] +$$

$$\sum_{k_\uparrow} \{S(k_\uparrow) \ln[\overline{S(k_\uparrow)}] - \overline{S(k_\uparrow)} - \ln[S(k_\uparrow)!]\}.$$

The extrema equations required to solve for the scene maximizing the probability are obtained by differentiating the logarithm of the appropriate probabilities with respect to the desired scene pixel element, $S(l_\circ)$. The differentiation operation yields $$\frac{\partial}{\partial S(l_\uparrow)} \ln[p(S|G)] \approx$$

$$\sum_m \sum_{j_\downarrow} \left\{ G_m(j_\downarrow) l \frac{\sum_{k_\uparrow} H_m(j_\downarrow - k_\uparrow) \delta_{l_\uparrow k_\uparrow}}{\sum_{k_\uparrow} H_m(j_\downarrow - k_\uparrow) S(k_\uparrow)} - \sum_{k_\uparrow} H_m(j_\downarrow - k_\uparrow) \delta_{l_\uparrow k_\uparrow} \right\} +$$

$$\sum_{k_\uparrow} (\delta_{k_\uparrow l_\uparrow} \ln[\overline{S(k_\uparrow)}] + \delta_{k_\uparrow l_\uparrow} - \delta_{k_\uparrow l_\uparrow} \ln[S(k_\uparrow)] - \delta_{k_\uparrow l_\uparrow})$$

and $$\frac{\partial}{\partial S(l_\uparrow)} \ln[p(S|G_{tot})] \approx$$

$$G_{tot} \frac{\sum_m \sum_{j_\downarrow} \sum_{k_\uparrow} H_m(j_\downarrow - k_\uparrow) \delta_{l_\uparrow k_\uparrow}}{\sum_m \sum_{j_\downarrow} \sum_{k_\uparrow} (j_\downarrow - k_\uparrow) S(k_\uparrow)} + \sum_m \sum_{j_\downarrow} \sum_{k_\uparrow} H_m(j_\downarrow - k_\uparrow) \delta_{l_\uparrow k_\uparrow} +$$

$$\sum_{k_\uparrow} \{\delta_{k_\uparrow l_\uparrow} \ln[\overline{S(k_\uparrow)}] + \delta_{k_\uparrow l_\uparrow} - \delta_{k_\uparrow l_\uparrow} \ln[S(k_\uparrow)] - \delta_{k_\uparrow l_\uparrow}\}$$

Simplifying the equations by summing over the Kronecker delta function indices produces, $$\frac{\partial}{\partial S(l_\uparrow)} \ln[p(S|G)] \approx$$

$$\sum_m \sum_{j_\downarrow} \left\{ G_m(j_\downarrow) \frac{H_m(j_\downarrow - l_\uparrow)}{\sum_{k_\uparrow} H_m(j_\downarrow - k_\uparrow) S(k_\uparrow)} - H_m(j_\downarrow - l_\uparrow) \right\} + \ln[\overline{S(l_\uparrow)}] - \ln[S(l_\uparrow)]$$

and $$\frac{\partial}{\partial S(l_\uparrow)} \ln[p(S|G_{tot})] \approx$$

$$G_{tot} \frac{\sum_m \sum_{j_\downarrow} H_m(j_\downarrow - l_\uparrow)}{\sum_m \sum_{j_\downarrow} \sum_{k_\uparrow} (j_\downarrow - k_\uparrow) S(k_\uparrow)} + -\sum_m \sum_{j_\downarrow} H_m(j_\downarrow - k_\uparrow) + \ln[\overline{S(l_\uparrow)}] - \ln[S(l_\uparrow)].$$

The set of equations associated with setting the derivative of the logarithm of the scene probability given the measurements are $$\frac{\partial}{\partial S(l_\uparrow)} \ln[p(S|G)] = 0$$

$$\approx \sum_m \sum_{j_\downarrow} \left\{ G_m(j_\downarrow) \frac{H_m(j_\downarrow - l_\uparrow)}{\sum_{k_\uparrow} H_m(j_\downarrow - k_\uparrow) S(k_\uparrow)} - H_m(j_\downarrow - l_\uparrow) \right\} +$$

$$\ln[\overline{S(l_\uparrow)}] - \ln[S(l_\uparrow)]$$

Solving for the logarithm of $S(l_\uparrow)$ yields a set of coupled nonlinear equation for $$\ln[S(1_\uparrow)] = \ln[\overline{S(1_\uparrow)}] + \left\{ \frac{\sum_m \sum_{j_\downarrow} H_m(j_\uparrow - 1_\uparrow) G_m(j_\uparrow)}{\sum_{k_\uparrow} H_m(j_\uparrow - k_\uparrow) S(k_\uparrow)} - \sum_m \sum_{j_\uparrow} H_m(j_\downarrow - k_\uparrow) \right\}.$$

Exponentiating produces $$S(1_\uparrow) = \overline{S(1_\uparrow)} e^{\left\{ \frac{\sum_m \sum_{j_\downarrow} H_m(j_\downarrow - 1_\uparrow) G_m(j_\downarrow)}{\sum_{k_\uparrow} H_m(j_\downarrow - k_\uparrow) S(k_\uparrow)} - \sum_m \sum_{j_\downarrow} H_m(j_\downarrow - 1_\uparrow) \right\}} \quad (35)$$

$$= \overline{S(1_\uparrow)} e^{\sum_m \sum_{j_\downarrow} \left\{ \frac{G_m(j_\downarrow)}{\sum_{k_\uparrow} H_m(j_\downarrow - k_\uparrow) S(k_\uparrow)} - 1 \right\} H_m(j_\downarrow - 1_\uparrow)}$$

The set of equations associated with setting the derivative of the logarithm of the scene probability given the summed total measurements are $$\frac{\partial}{\partial S(1_\uparrow)} \ln[p(S|G_{tot})] = 0$$

$$= G_{tot} \frac{\sum_m \sum_{j_\downarrow} H_m(j_\downarrow - 1_\uparrow)}{\sum_m \sum_{j_\downarrow} \sum_{k_\uparrow} H_m(j_\downarrow - k_\uparrow) S k_\uparrow)} -$$

$$\sum_m \sum_{j_\downarrow} H_m(j_\downarrow - 1_\uparrow) + \ln[\overline{S(1_\uparrow)}] - \ln S(1_\uparrow).$$

Solving for the logarithm of $S(1_\uparrow)$ yields a set of coupled nonlinear equation for $$\ln[S(1_\uparrow)] = \ln[\overline{S(1_\uparrow)}] + \left\{ G_{tot} \frac{\sum_m \sum_{j_\downarrow} H_m(j_\downarrow - 1_\uparrow)}{\sum_m \sum_{j_\downarrow} \sum_{k_\uparrow} H_m(j_\downarrow - k_\uparrow) S(k_\uparrow)} - \sum_m \sum_{j_\downarrow} H_m(j_\downarrow - 1_\uparrow) \right\}.$$

Exponentiating produces

-continued $$S(1_\uparrow) = \overline{S(1_\uparrow)}\exp\left\{G_{tot}\sum_m \frac{\Sigma_{j_\downarrow}H_m(j_\downarrow-1_\uparrow)}{\Sigma_m\Sigma_{j_\downarrow}\Sigma_{k_\uparrow}H_m(j_\downarrow-k_\uparrow)S(k_\uparrow)} - \Sigma_m\Sigma_{j_\downarrow}H_m(j_\downarrow-1_\uparrow)\right\} \quad (36)$$

$$= \overline{S(1_\uparrow)}\exp\left\{\left\{\frac{G_{tot}}{\Sigma_m\Sigma_{j_\downarrow}\Sigma_{k_\uparrow}H_m(j_\downarrow-k_\uparrow)S(k_\uparrow)} - 1\right\}\Sigma_m\Sigma_{j_\downarrow}H_m(j_\downarrow-1_\uparrow)\right\}$$

The two sets of equations (35) and (36) can be solved simultaneously to formulate an estimation procedure for $\overline{S(1_\circ)}$ or $\overline{S(1_\circ)}$.

The SuperSpinAp embodiments in described above apply the maximum a posteriori estimation technique. An alternate approach to SuperSpinAp processing uses a Bayes estimation approach commonly refereed to as maximum likelihood estimation.

Maximum likelihood estimation seeks a value of the unknown object that maximizes the conditional probability of the measurements given the object. That is, the maximum likelihood estimate of the object is the object that most likely led to the entire set of observed SpinAp sensor measurements.

As before, G is the total measurement matrix, which is a block column matrix consisting of individual frame measurement matrices, given by $$G = \begin{pmatrix} G_1 \\ G_2 \\ \vdots \\ G_{n_f-1} \\ G_{n_f} \end{pmatrix} \quad (37)$$

where $n_f$ is the total number of frames acquired. S is a block column matrix associated with $n_f$ realizations of the random scene $$S = \begin{pmatrix} S_1 \\ S_2 \\ \vdots \\ S_{n_f-1} \\ S_{n_f} \end{pmatrix} \quad (38)$$

Given that the scene S is a random field, a maximum likelihood estimate of the scene mean is calculated. The maximum likelihood estimate is the value of the scene mean, $\overline{S}$, which maximizes the likelihood function $P(G|\overline{S})$.

For statistically independent frame measurements the joint probability density of the total measurement vector given the scene can be expressed as the product of individual $m^{th}$ frame densities $$p(G|\overline{S}) = \prod_m p(G_m|\overline{S}). \quad (39)$$

Likewise, for statistically independent detector measurements the conditional probability of the occurrence of the frame measurement given the scene can be expressed as a product of the individual pixel probability densities conditioned on the scene, $$p(G_m|\overline{S}) = \prod_j p(G_m(j)|\overline{S}). \quad (40)$$

The total measurement conditional probability density is therefore given by the product of pixel and frame measurement probabilities conditioned on the scene, $$p(G|\overline{S}) = \prod_m \prod_j p(G_m(j)|\overline{S}). \quad (41)$$

Assuming individual detector measurements are a Poisson process, the individual measurement conditional probabilities can be expressed as, $$P(G_m(j)|\overline{S}) = \frac{\left(\sum_{k\uparrow}H_m(j-k)\overline{S}(k)\right)^{G_m(j)}\exp^{-\Sigma_k H_m(j-k)\overline{S}(k)}}{G_m(j)!}$$

where $$\sum_k H_m(j-k)\overline{S}(k)$$

is the mean value of the individual detector measurement.

Since finding the scene that maximizes the conditional probability density is equivalent to finding the scene that maximizes the logarithm of the probability density, solutions for $\overline{S}$ are sought that maximize $$\ln[p(G|\overline{S})]. \quad (42)$$

Recognizing the logarithm of products is the sum of logarithms, the probability of the measurement matrix G given $\overline{S}$ can be expressed as $$\ln[p(G|S)] = \sum_j \sum_m p(G_m(j)|\overline{S}). \quad (43)$$

Substituting Equation (43) into Equation (42) yields $$\ln[p(G|\overline{S})] = \sum_m \sum_j \left\{G_m(j)\ln\left[\sum_k H_m(j-k)\overline{S}(k)\right]\right\} - \sum_m \sum_k \{H_m(j-k)\overline{S}(k) - \ln[G_m(j)!]\}.$$

To determine the value of $\overline{S}(l)$ that maximizes the conditional probability, the value of $\overline{S}(l)$ for which the derivative of $\ln[p(G|\overline{S})]$ vanishes is required. The derivative of $\ln[p(G|\overline{S})]$ is given by $$\frac{\partial}{\partial \overline{S}(1)}\ln[p(G|S)] = \sum_m \sum_j \left\{G_m(j)\frac{[H_m(j-1)]}{\sum_k H_m(j-k)\overline{S}(k)} - [H_m(j-1)]\right\}$$

Setting the derivative to zero yields the nonlinear equation to be solved for $\overline{S}$ $$\sum_m \sum_j [H_m(j-1)] = \sum_m \sum_j \left\{ G_m(j) \frac{[H_m(j-1)]}{\sum_k H_m(j-k)\overline{S}(k)} \right\}. \quad (44)$$

In most implementations the left hand side will sum to $n_f$, due to the photon conserving properties of optical systems. To apply Picard's technique, each side of Equation (44) is multiplied by $\overline{S}(l)$ and the estimate is formed iteratively as $$(\overline{S}(l))^{[n+1]} = (\overline{S}(l))^{[n]} \frac{1}{n_f} \sum_m \sum_j \left\{ \frac{G_m(j)}{\left( \sum_k H_m(j-k)\overline{S}(1) \right)} \right\} \cdot H_m(j-1).$$

where the superscript n indicates the iteration number.

This method of computing the SuperSpinAp maximum likelihood estimate is an expectation maximization algorithm. Expectation maximization algorithms converge to a maximum likelihood estimate of the scene mean.

For each iteration of the algorithmic procedure just described, a multiplicative correction factor is computed from the entire set of $n_f$ SpinAp measurements. A recursive expectation maximization algorithm may be used to compute the maximum likelihood estimate. A recursive algorithm updates the estimate based on each frame individually, thereby reducing the computational requirements for determining the maximum likelihood estimation.

The recursive form of the expectation maximization algorithm extends the method developed by Titterington in Journal of the Royal Statistical Society—B, Vol. 46, No. 2, pages 257–267, 1984) to apply to the SuperSpinAp. The following recursive expectation maximization algorithm is obtained for $n=0,1,\ldots$, for $m=0,1,\ldots, N_f-1$, for $l=1,2,\ldots, N_{pixel}$ $$\hat{S}_{m+1}^{[n+1]}(l) = \hat{S}_m^{[n+1]}(l) + \frac{1}{m-1} \left[ \left( \hat{S}(l) \right)_m^{[n+1]}(l) \sum_j \frac{G_m(j)}{\sum_k h_m(j-k)\hat{S}_m^{[n+1]}(k)} h_m(j-1) - \hat{S}_m^{[n+1]}(l) \right],$$

where:

$$\left( \hat{S}(l) \right)_0^{[n+1]} [n+1] = \hat{S}_{N_f-1}^{[n+1]}(l)$$

This recursive expectation maximization algorithm may be initialized using the methods described previously, or be initializing each element of the scene mean estimate to a constant value based on the average number of photons in the SpinAp frames $$\hat{S}_0^{[0]}(l) = \frac{1}{n_f n_{pixel}} \sum_m \sum_j G_m(j), \forall l.$$

The SuperSpinAp embodiments described above comprise two broad solution approaches for estimating the unknown scene—maximum a posteriori estimation, and maximum likelihood estimation. Within the category of maximum a posteriori estimates, four embodiments are disclosed including a maximum a posteriori approach in which the scene mean $\overline{S}(l)$ is estimated in an ad hoc manner, by estimating the scene mean as equal to the current estimate of the scene, a maximum a posteriori approach in which the scene mean $\overline{S}(l)$ is estimated using sample statistics, resulting in a recursive algorithm for estimating each realization of the scene $S_q(l)$, followed by a re-estimation of the sample mean, a maximum a posteriori approach in which a single probability density function is formulated on the measurements and the total photons in the set of measured SpinAp frames, and a maximum a posteriori approach in which a separate probability density function is formulated on the total photons in the set of measured SpinAp frames, followed by simultaneous solution of two sets of nonlinear equations.

Within the category of maximum likelihood estimates, two embodiments have been described. The first embodiment uses the set of measured SpinAp frames to form an estimate of the scene ensemble mean $\overline{S}(l)$ in which the entire set of SpinAp frames is used in each update of the estimate. In the second maximum likelihood embodiment, a recursive algorithm is used, in which the scene ensemble mean estimate is updated using one SpinAp frame measurement at a time. Each of the maximum likelihood embodiments are expectation maximization procedures, thereby guaranteeing that the Picard iterations converge to a maximum likelihood estimate.

Figure 12:
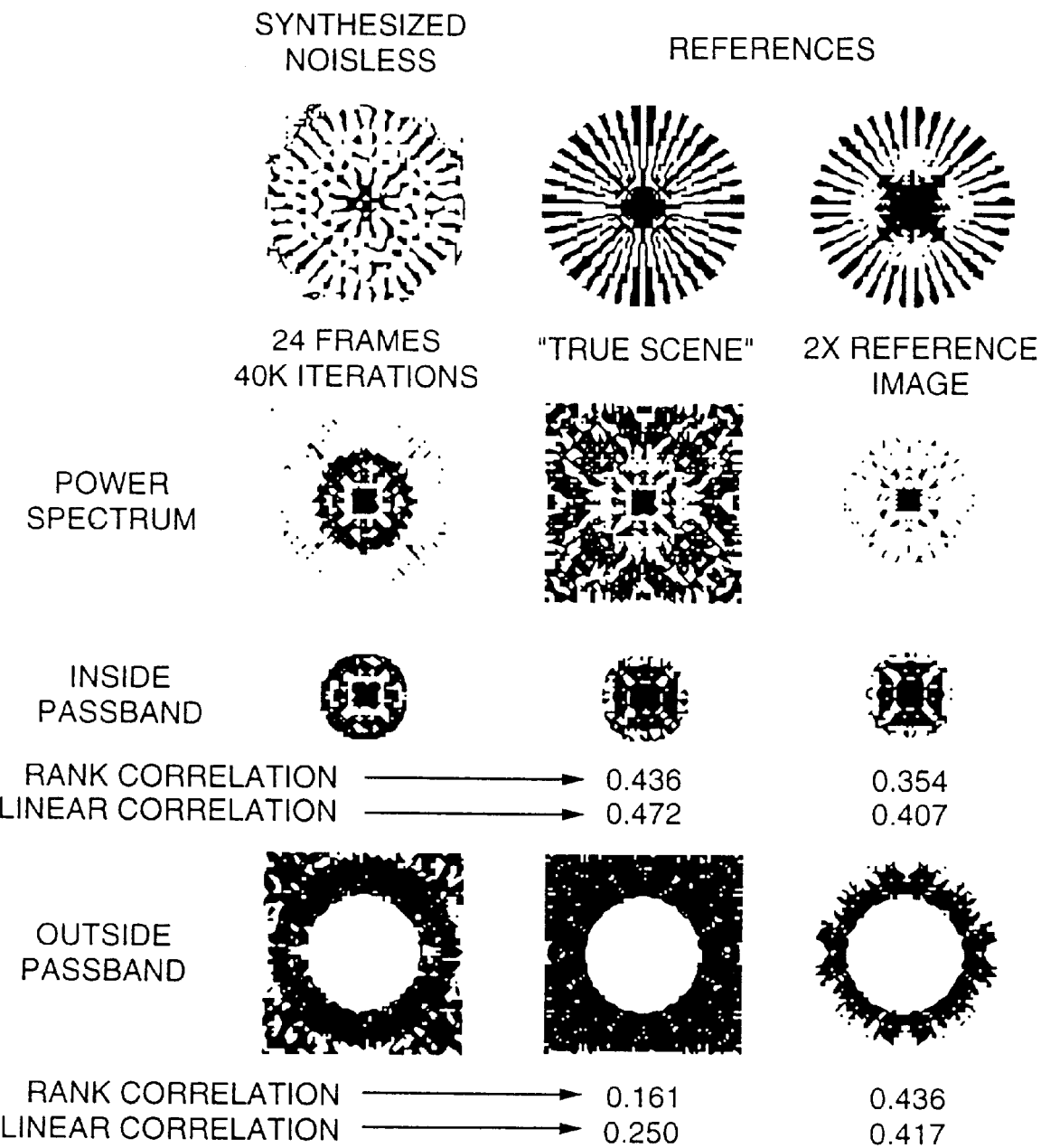
FIGS. 12–14 show test results using the present invention for various test patterns.
Figure 13:
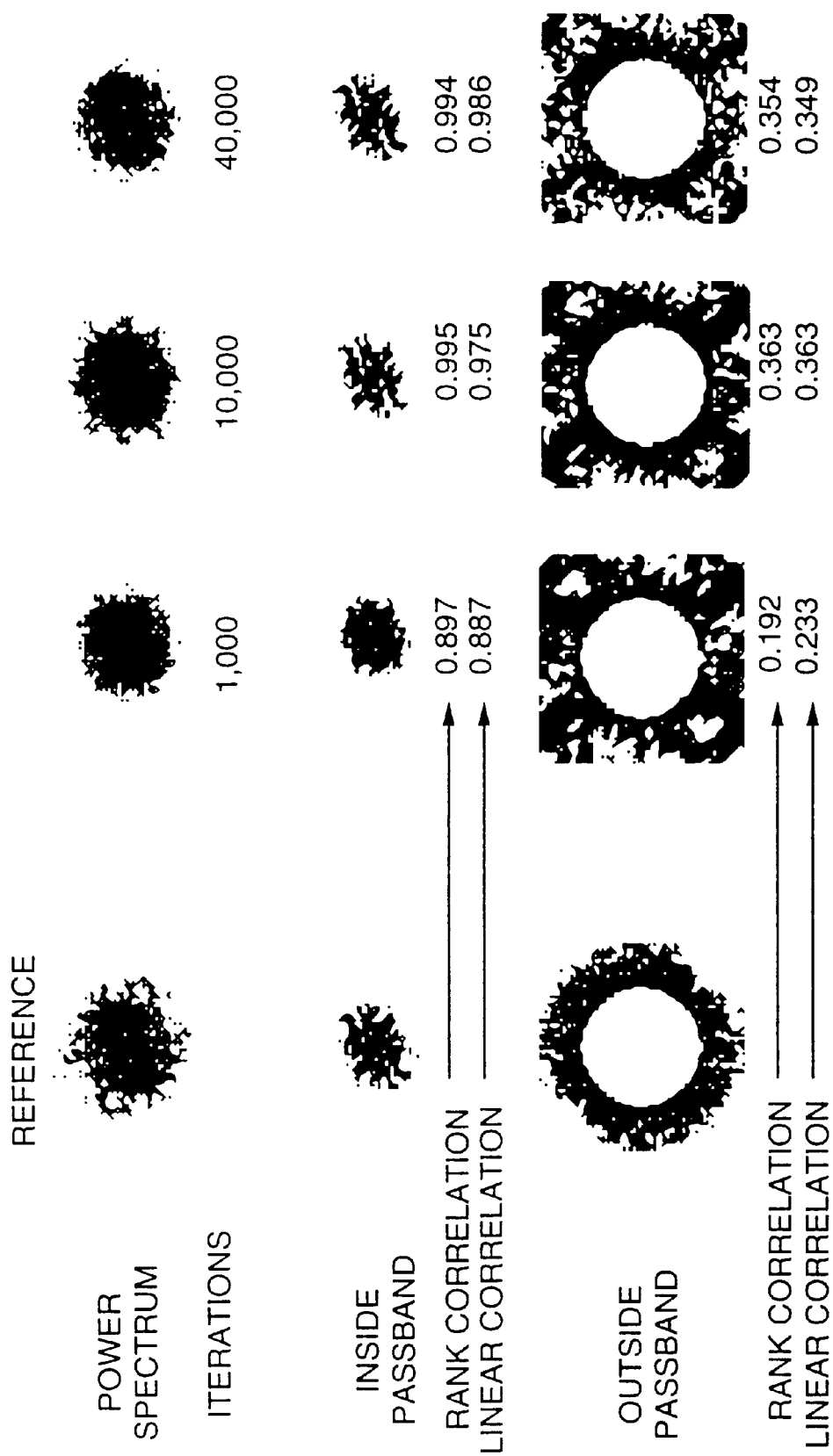
Figure 14:
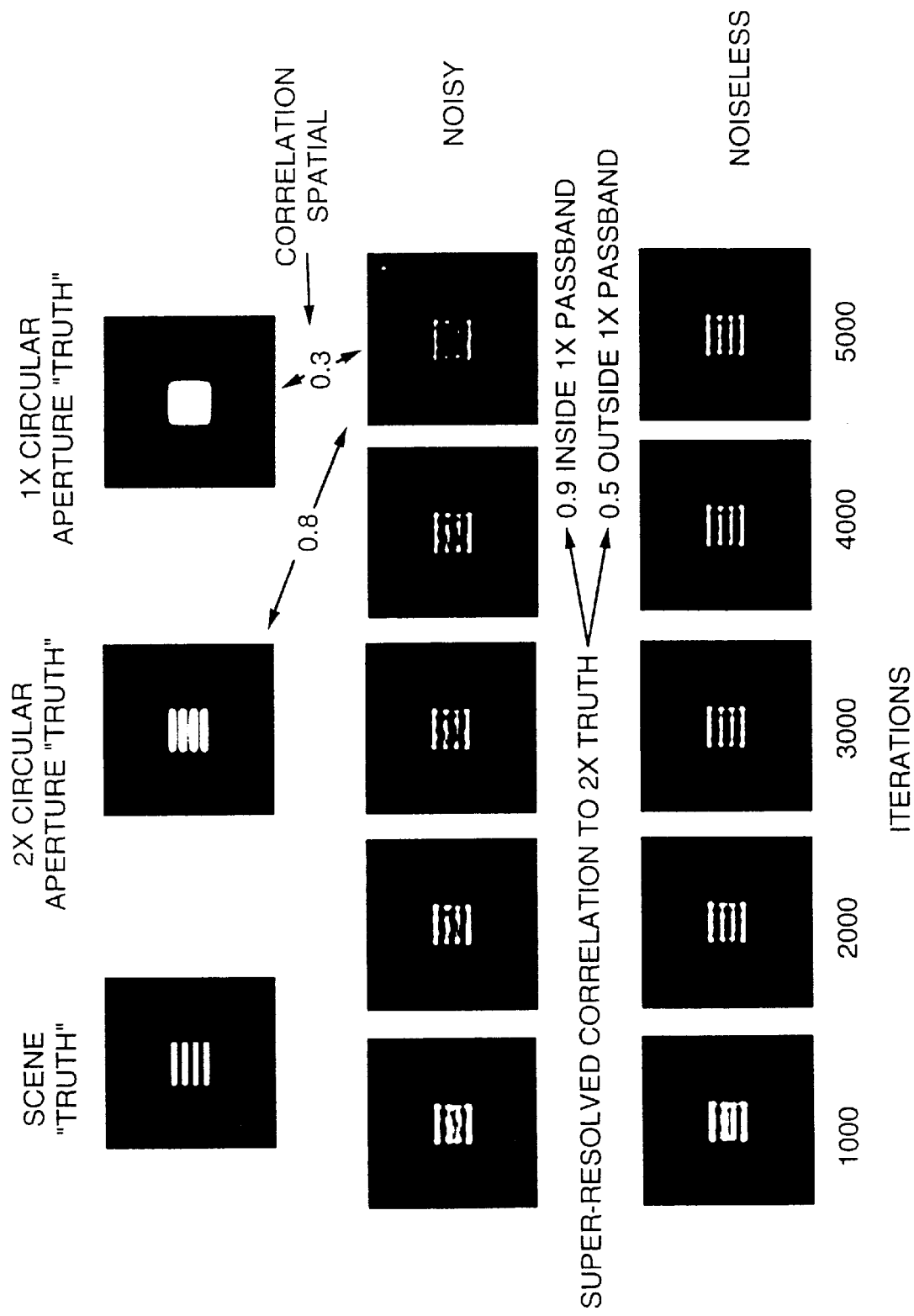

For completeness, FIG. 12 depicts results of a demonstration of the SuperSpinAp synthesis method 30 use to generate a super-resolved image of a radial test pattern. FIG. 13 depicts an example of SuperSpinAp synthesis performance. Quantitative measures of the performance are obtained by determining correlation coefficients between the known reference power spectrum of an object and the power spectrum of the super-resolved image. FIG. 14 depicts an example of SuperSpinAp synthesis performance where the true scene is a horizontal bar target. Quantitative measures of the performance are found by determining correlation coefficients between the known reference power spectrum of an object and the power spectrum of the super-resolved image.

Thus, a spinning strip (partial) aperture imaging radiometer and method that synthesizes super-resolved scene estimates from a plurality of rotating strip aperture image measurements have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A spinning strip aperture sensor system comprising:
   a telescope having an optical axis, the telescope being comprised of a rotating strip aperture having a predetermined spatial frequency cutoff, which telescope and strip aperture rotate about the optical axis to produce temporally sequential images of a scene;
   a two dimensional optical detector array disposed at a focal plane of the telescope for generating a set of strip aperture images; and
   a signal processor coupled to the detector array for recording a plurality of image frames of the imaged scene comprising the set of strip aperture images as the rotating strip aperture rotates about the optical axis of the telescope, and comprising an estimation processor for synthesizing estimates of the imaged scene from the recorded image frames for spatial frequencies larger in magnitude than the spatial frequency cutoff of the rotating strip aperture.

2. The system of claim 1 wherein the signal processor further comprises a frame registration error processor coupled to the estimation processor for determining residual registration errors between individual frames of the set of strip aperture images.

3. The system of claim 2 wherein the signal processor further comprises a bandlimited image synthesis processor coupled between the frame registration error processor and the estimation processor for generating images representative of a full circular aperture.

4. The system of claim 3 wherein the signal processor further comprises:
    an image synthesis data base for storing a priori knowledge corresponding to the imaged scene; and
    a training algorithm processor coupled between the bandlimited image synthesis processor and the image synthesis data base for extracting scene content and structure information from the strip aperture images, and for modifying the a priori information contained in the image synthesis data base, which information is processed by the signal processor to generate an estimate of the imaged scene.

5. The system of claim 1 wherein the estimation processor synthesizes estimates of the imaged scene using a maximum a posteriori estimation procedure.

6. The system of claim 5 wherein the maximum a posteriori estimation procedure estimates a scene mean by assuming that the scene mean is equal to a current estimate of the imaged scene.

7. The system of claim 5 wherein the maximum a posteriori estimation procedure estimates a scene mean using sample statistics, thus implementing a recursive algorithm that estimates each realization of the imaged scene, followed by a re-estimation of the scene mean.

8. The system of claim 5 wherein the maximum a posteriori estimation procedure estimates a single probability density function based upon the total number of photons in a set of measured frames.

9. The system of claim 5 wherein the maximum a posteriori estimation procedure estimates a separate probability density function based upon the total number of photons in a set of measured frames, followed by simultaneous solution of two sets of nonlinear equations.

10. The system of claim 1 wherein the estimation processor synthesizes estimates of the imaged scene using a maximum likelihood estimation procedure.

11. The system of claim 10 wherein the maximum likelihood estimation procedure uses a set of the recorded image frames to form a scene ensemble mean estimate in which the entire set of recorded image frames is used in each update of the scene ensemble mean estimate.

12. The system of claim 11 wherein the maximum likelihood estimation procedure uses a recursive algorithm in which the scene ensemble mean estimate is updated using one recorded image frame at a time.

13. An image synthesizing method for use in an imaging system comprising a spinning strip aperture telescope that rotates about an optical axis of the telescope, a two-dimensional optical detector array for detecting images located at a focal plane of the telescope, rotation compensation means for providing a stationary image during an integration time of detectors of the detector array, and a signal processor for recording a plurality of image frames of a scene imaged by the detector array through the telescope as the telescope rotates about its optical axis, and for synthesizing a full circular aperture image from the recorded image frames, wherein the image synthesizing method comprises the following steps:
    generating a plurality of image frames of the scene using the detector array, each image frame being generated at a particular rotational position of the telescope as the telescope rotates about its optical axis;
    recording each of the plurality of image frames; and
    synthesizing a full aperture image spectrum by forming a product of a current estimate of the imaged scene with a nonlinear function of the current estimate.

14. The image synthesizing method of claim 13 wherein the nonlinear function of the current estimate is an exponential product of the plurality of recorded image frames scaled by the number of recorded image frames that are recorded and wherein the arguments of the exponentials are a function of the recorded image frames, a response function of the imaging system, and the current estimate of the imaged scene.

15. The image synthesizing method of claim 14 wherein argument of the exponentials is associated with a particular recorded image frame and the corresponding rotational position and wherein each argument is obtained by performing a convolution of a reflection of a response function of the imaging system for the particular rotational position with an auxiliary function.

16. The image synthesizing method of claim 15 wherein the auxiliary function is determined by dividing pixel measurements of the recorded image frames by a factor comprising a convolution of the current estimate of the imaged scene with the response function of the imaging system for the particular rotational position.

17. The image synthesizing method of claim 15 which further comprises the step of correcting the recorded image frames for residual registration errors between individual recorded image frames.

18. The image synthesizing method of claim 17 wherein the step of correcting for residual registration errors comprises the steps of:
    interpolating and coordinate transforming a recorded image frame such that it corresponds to a reference coordinate grid of the current scene estimate;
    estimating frame-to-frame misregistration of the recorded image frames due to random line of sight errors;
    correcting a selected one of the recorded image frames for the line of sight errors and storing the corrected image frame; and
    sequentially repeating the preceding steps for each recorded image frame.

19. The image synthesizing method of claim 18 which further comprises the step of generating images representative of full circular aperture bandlimited images using the corrected image frames, the set of uncorrected recorded image frames and registration error estimates between the corrected image frames and the recorded image frames;
    and wherein the step of synthesizing the full aperture image spectrum uses the corrected frames, the set of uncorrected frames and registration error estimates between the corrected image frames and the recorded image frames, and the full circular aperture bandlimited images to generate the current estimate of the imaged scene.

20. The image synthesizing method of claim 19 wherein the steps of generating images representative of full circular aperture bandlimited images and synthesizing the full aperture image spectrum comprise processing a priori information regarding the imaged scene.

21. The image synthesizing method of claim 20 which further comprises the steps of:
    processing data contained in the full circular aperture bandlimited image to extract scene content and structure information and modifying the a priori information regarding the imaged scene structure in accordance with a predetermined training algorithm.

* * * * *